(12) United States Patent
Lee et al.

(10) Patent No.: US 11,359,973 B2
(45) Date of Patent: Jun. 14, 2022

(54) MEMS DEVICE HAVING CURVED REFLECTIVE LAYER AND METHOD FOR MANUFACTURING MEMS DEVICE

(71) Applicant: KOREA ADVANCED INSTITUTE OF SCIENCE AND TECHNOLOGY, Daejeon (KR)

(72) Inventors: Jong-Kwon Lee, Daejeon (KR); Jae-Sub Oh, Daejeon (KR); Jongcheol Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/328,773

(22) Filed: May 24, 2021

(65) Prior Publication Data

US 2021/0278282 A1 Sep. 9, 2021

Related U.S. Application Data

(63) Continuation of application No. PCT/KR2019/015379, filed on Nov. 13, 2019.

(30) Foreign Application Priority Data

Nov. 28, 2018 (KR) ........................ 10-2018-0149085

(51) Int. Cl.
*G01J 5/58* (2022.01)
*B81B 7/02* (2006.01)
(Continued)

(52) U.S. Cl.
CPC ................. *G01J 5/58* (2013.01); *B81B 7/02* (2013.01); *G01J 5/024* (2013.01); *G01J 5/0215* (2013.01);
(Continued)

(58) Field of Classification Search
CPC .. G01J 5/58; G01J 5/0215; G01J 5/024; G01J 5/0808; G01J 5/0225; G01J 2005/0077;
(Continued)

(56) References Cited

U.S. PATENT DOCUMENTS 6,198,099 B1 3/2001 Kim
7,554,085 B2 6/2009 Lee
(Continued)

FOREIGN PATENT DOCUMENTS

JP 2007-509315 A 4/2007
KR 10-2011-0076791 A 7/2011
(Continued)

*Primary Examiner* — David P Porta
*Assistant Examiner* — Gisselle M Gutierrez
(74) *Attorney, Agent, or Firm* — Andrew D. Fortney; Central California IP Group, P.C.

(57) ABSTRACT

A MEMS device according to an example embodiment of the present disclosure includes: a lower substrate; an infrared sensor formed on the lower substrate; and a lower bonding pad disposed to cover the infrared sensor. The infrared sensor includes: a metal pad formed on an upper surface of the lower substrate and electrically connected to a detection circuit; a reflective layer formed on the upper surface of the lower substrate and reflecting an infrared band; an absorption plate disposed to be spaced apart from an upper portion of the reflective layer and absorbing infrared rays to change resistance; and an anchor formed on the metal pad to support the absorption plate and to electrically connect the metal pad and the absorption plate to each other. The reflective layer has a curved or stepped shape such that a distance between the reflective layer and the absorption plate varies depending on a position of the reflective layer.

12 Claims, 15 Drawing Sheets

(51) Int. Cl.
*G01J 5/02* (2022.01)
*G01J 5/0808* (2022.01)

(52) U.S. Cl.
CPC ..... *G01J 5/0808* (2022.01); *B81B 2201/0207* (2013.01)

(58) Field of Classification Search
CPC .... G01J 5/045; B81B 7/02; B81B 2201/0207; B81B 2201/042; B81C 1/00055; B81C 1/00317
See application file for complete search history.

(56) References Cited

U.S. PATENT DOCUMENTS

| | | |
|---|---|---|
| 8,519,336 B2 | 8/2013 | Ohhira et al. |
| 2007/0262256 A1* | 11/2007 | Lee ............... G01J 5/20 |
| | | 250/338.1 |
| 2011/0155914 A1* | 6/2011 | Oh ............... G01J 5/0853 |
| | | 250/338.4 |

FOREIGN PATENT DOCUMENTS

| | | | |
|---|---|---|---|
| KR | 10-1250447 B1 | 4/2013 | |
| KR | 10-1569350 B1 | 11/2015 | |
| KR | 102358860 B1 * | 2/2022 | ............... B81B 7/02 |

* cited by examiner

MEMS DEVICE HAVING CURVED REFLECTIVE LAYER AND METHOD FOR MANUFACTURING MEMS DEVICE

CROSS-REFERENCE TO RELATED APPLICATIONS

This application is a continuation of and claims priority to PCT/KR2019/015379 filed on Nov. 13, 2019, which claims priority to Korea Patent Application No. 10-2018-0149085 filed on Nov. 28, 2018, the entireties of which are both hereby incorporated by reference.

TECHNICAL FIELD

The present disclosure relates to a MEMS device and, more particularly, to a MEMS device having an infrared sensor MEMS device having high absorption in a wide infrared band.

BACKGROUND

A bolometer is a type of infrared sensor. The bolometer is formed on a lower substrate. The bolometer absorbs incident infrared rays. When a temperature of an absorption plate of the bolometer is increased, a change in resistance of a resistive layer caused by the increase in temperature is detected and energy of infrared rays is measured from the change in resistance.

A cap substrate includes an upper substrate, separate from a lower substrate. The cap structure is packaged while being wafer-bonded to the lower substrate to form a cavity.

An existing microbolometer adopt a structure, in which a distance between an absorption plate and a reflector has a ¼ wavelength of a specific infrared ray, increase infrared absorption. Accordingly, the existing microbolometer has a maximum absorption at a specific infrared wavelength.

SUMMARY

An aspect of the present disclosure is to provide an infrared MEMS device having absorption increased by changing a structure of an absorption plate.

A MEMS device according to an example embodiment of the present disclosure includes: a lower substrate; an infrared sensor formed on the lower substrate; and a lower bonding pad disposed to surround the infrared sensor. The infrared includes: a metal pad formed on an upper surface of the lower substrate to be electrically connected to a detection circuit; a reflective layer formed on the upper surface of the lower substrate and reflecting an infrared band; an absorption plate formed to be spaced apart from an upper portion of the reflective layer and absorbing infrared rays to change resistance; and an anchor formed in an upper portion of the metal pad to support the absorption plate and to electrically connect the metal pad and the absorption plate to each other. The reflective layer has a curved or stepped shape such that a distance between the reflective layer and the absorption plate varies depending on a position of the reflective layer.

In an example embodiment, the distance between the reflective layer and the absorption plate may range from 1.5 micrometers to 3 micrometers depending on a position.

In an example embodiment, an upper surface of the reflective layer may have a depressed curved surface.

In an example embodiment, an upper surface of the reflective layer may include a plurality of depressed portions.

In an example embodiment, an upper surface of the reflective layer may be formed to have a stepped shape.

A method of manufacturing a MEMS device according to an example embodiment of the present disclosure includes: forming an insulating layer on a lower substrate; forming a preliminary reflective layer and a metal pad on the insulating layer; patterning the preliminary reflective layer to form a reflective layer having a curved or stepped shape; forming a protective layer on the reflective layer; and forming an anchor, connected to the metal pad, and an absorption plate disposed to be spaced apart from the reflective layer and supported by the anchor.

In an example embodiment, the patterning of the preliminary reflective layer to form a reflective layer having a curved or stepped shape may include: depositing an auxiliary insulating layer on the metal pad and the preliminary reflective layer and patterning the auxiliary insulating layer to form an auxiliary insulating pattern such that the preliminary reflective layer is exposed; and spin-coating a thin film on the auxiliary insulating pattern and the preliminary reflective layer to form a curved shape on the preliminary reflective layer.

In an example embodiment, the patterning of the preliminary reflective layer to form a reflective layer having a curved or stepped shape may include: depositing an auxiliary insulating layer on the metal pad and the preliminary reflective layer and patterning the auxiliary insulating layer to form an auxiliary insulating pattern such that the preliminary reflective layer is exposed; forming a photoresist thin film on the auxiliary insulating pattern and the preliminary reflective layer and exposing the photoresist thin film to form a photoresist pattern having a depressed curved surface; and drying-etching the photoresist pattern and the preliminary reflective layer to form a reflective layer having a depressed curved shape.

In an example embodiment, the patterning of the preliminary reflective layer to form a reflective layer having a curved or stepped shape may include: depositing an auxiliary insulating layer on the metal pad and the preliminary reflective layer and patterning the auxiliary insulating layer to form an auxiliary insulating pattern such that the preliminary reflective layer is exposed; forming a first photoresist pattern exposing a portion of the preliminary reflective layer and etching the preliminary reflective layer to form a depressed reflective layer; forming a second photoresist pattern the depressed reflective layer and a portion of the preliminary reflective layer around the depressed reflective layer and etching the depressed reflective layer to form a reflective layer having a stepped structure.

In an example embodiment, forming of an anchor, connected to the metal pad, and an absorption plate disposed to be spaced apart from the reflective layer and supported by the anchor may include: forming a contact hole to expose the metal pad after a sacrificial layer and a first insulating layer are formed on the protective layer; depositing an anchor conductive layer on the lower substrate in which the contact hole is formed and patterning the anchor conductive layer to form an anchor; forming an absorption layer on the lower substrate on which the anchor is formed and patterning the absorption layer to be separated; forming a resistive layer and a second insulating layer on the absorption layer and patterning the second insulating layer, the resistive layer, the absorption layer, and the first insulating layer to expose the sacrificial layer; and removing the sacrificial layer.

MEMS device according to an example embodiment of the present disclosure includes: a sensor substrate provided with an infrared sensor; and a cap substrate wafer-bonded to the sensor substrate to constitute a cavity. The sensor substrate may include: a lower substrate; an infrared sensor formed on the lower substrate; and a lower bonding pad disposed to surround the infrared sensor. The infrared sensor may include: a metal pad formed on an upper surface of the lower substrate to be electrically connected to a readout integrated circuit; a reflective layer formed on an upper surface of the lower substrate and reflecting an infrared band; an absorption plate formed to be spaced apart from an upper portion of the reflective layer and absorbing infrared rays to change resistance; and an anchor formed in an upper portion of the metal pad to support the absorption plate and to electrically connect the metal pad and the absorption plate to each other. The reflective layer may have a curved or stepped shape such that a distance between the reflective layer and the absorption plate varies depending on a position of the reflective layer.

In an example embodiment, the cap substrate includes: an upper substrate; a getter disposed in a cavity region depressed on a lower surface of the upper substrate; a partition wall further protruding than the cavity region on the lower surface of the upper substrate, having the same structure and material as the upper substrate, and disposed to surround the cavity region; a recess region further depressed than a disposition plane of the cavity region on the lower surface of the upper substrate and disposed to surround the partition wall; and an upper bonding pad disposed on a lower surface of the partition wall.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Wafer-level vacuum packaging may bond a MEMS device substrate and a cap substrate. The MEMS device substrate may include an infrared sensor, such as a bolometer, and a readout integrated circuit (ROIC). The cap substrate may be bonded to the MEMS device substrate to form a vacuum cavity, and may provide a window through which external infrared light may pass.

A bolometer may transmit externally incident infrared rays to an infrared absorbing layer. When a temperature of the infrared absorbing layer is increased, the increase in temperature of the infrared absorbing layer may cause a change in resistance of a resistive layer. The change in resistance of the resistive layer is converted into infrared energy through a readout integrated circuit A MEMS device according to an example embodiment of the present disclosure may include a reflective layer having a recessed curved or stepped shape. A distance between the reflective layer and the absorption plate of the MEMS device may vary depending on a position, and may satisfy a condition of ¼ wavelength for a wide infrared wavelength range. Thus, an absorption rate of the absorption plate may be increased to improve sensitivity of an infrared sensor.

Hereinafter, embodiments of the present disclosure will be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
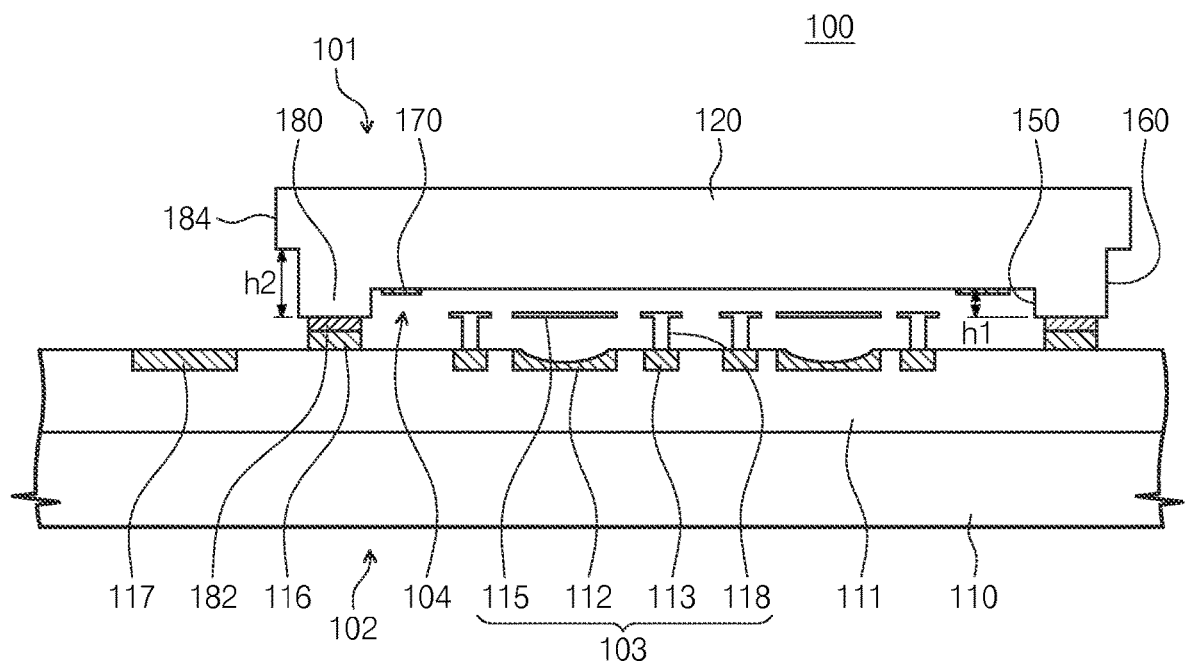
FIG. 1 is a conceptual diagram of a MEMS device according to an example embodiment of the present disclosure.

FIG. 1 is a conceptual diagram of a MEMS device according to an example embodiment of the present disclosure.

Figure 2A:
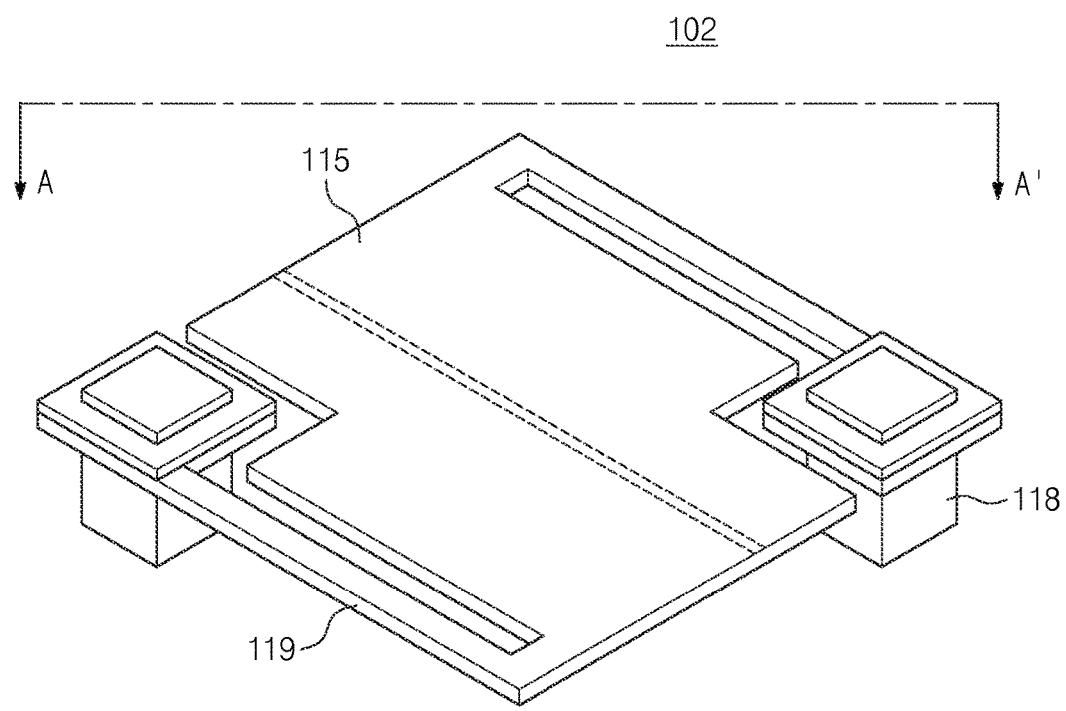
FIG. 2A is a perspective view of a sensor substrate of a MEMS device according to an example embodiment of the present disclosure.

FIG. 2A is a perspective view of a sensor substrate of a MEMS device according to an example embodiment of the present disclosure.

Figure 2B:
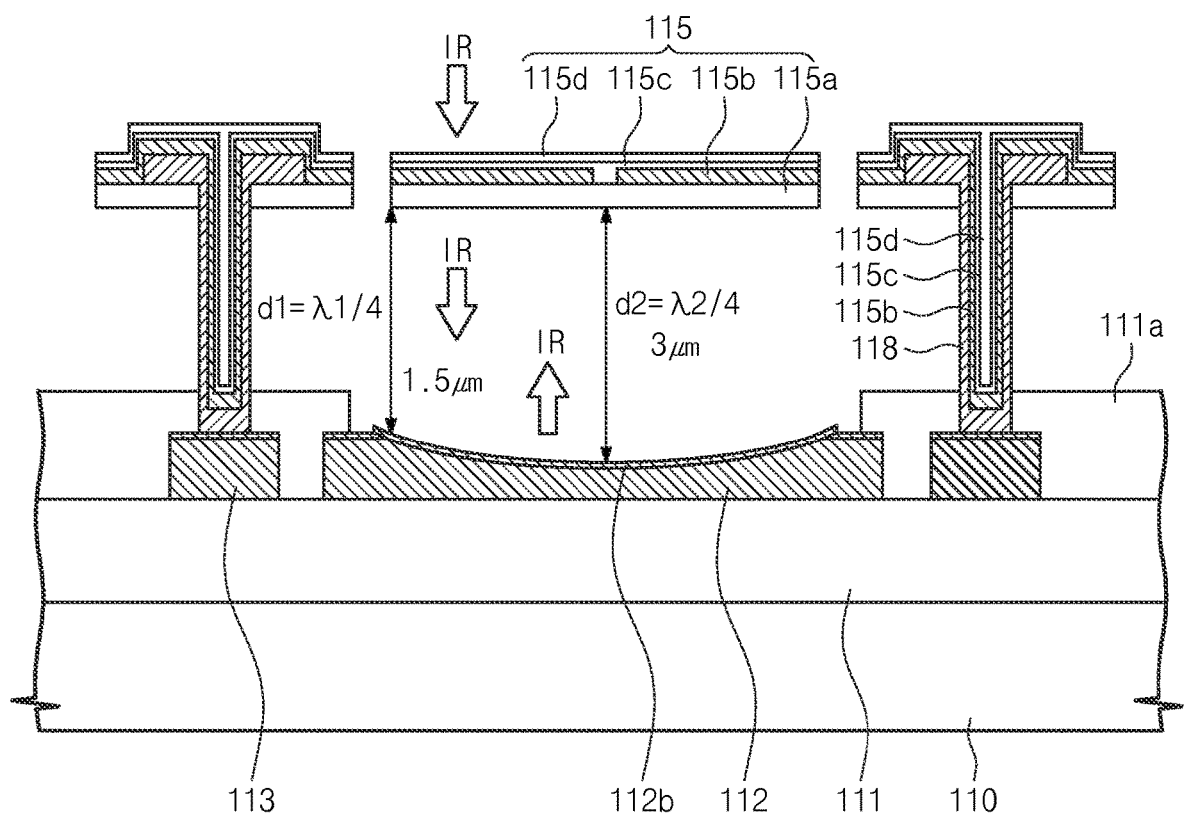
FIG. 2B is a cross-sectional view taken along line A-A' of FIG. 2A.

FIG. 2B is a cross-sectional view taken along line A-A' of FIG. 2A.

Referring to FIGS. 1, 2A and 2B, a MEMS device 100 may include a sensor substrate 102 having an infrared sensor 103; and a cap substrate 101 wafer-bonded to the sensor substrate 102 to constitute a cavity 104.

The cap substrate 101 may include an upper substrate 120; a getter 170 disposed in the cavity region 150 depressed from a lower surface of the upper substrate 120; a partition wall 180 further protruding from the lower surface of the upper substrate 120 than the cavity region 150, having the same structure and material as the upper substrate 120, disposed to surround the cavity region 150; a recess region 160 disposed to be further recessed from the lower surface of the upper substrate 120 than a disposition plane of the cavity region 150 and to surround the partition wall 180, and an upper bonding pad 182 disposed on a lower surface of the partition wall 180.

The sensor substrate 102 may include a lower substrate 110; an infrared sensor 103 formed on the lower substrate 110 and disposed to face the cavity region 150 of the upper substrate 120; and a lower bonding pad 116 aligned with the upper bonding pad 182 and disposed to surround the infrared sensor 103. Each of the upper substrate 120 and the lower substrate 110 is a silicon substrate.

The cap substrate 101 may include the upper substrate 120, the partition wall 180 protruding from the lower surface of the upper substrate 120, and a getter 170 formed in the cavity region 150. The cap substrate 101 is bonded to the sensor substrate 102 to form a cavity 104. The cavity 104 may be maintained in a vacuum state.

The upper substrate 120 may be a silicon substrate. The upper substrate 120 operates as a substrate for forming the cavity region 150, the partition wall 180, the recess region 160, and a cut portion 184. The upper substrate 120 may have a thickness of several hundred micrometers or more to sufficiently withstand even when a vacuum is formed in the cavity 104.

The cavity region 150 may provide a cavity 104 sealed by the sensor substrate 102. A depression depth h1 of the cavity region 150 may be several micrometers to several hundred micrometers. The depression depth h1 of the cavity area 150 may depend on a height of the infrared sensor 103. Conventionally, when an infrared wavelength of 20 μm is detected, the height of the infrared sensor 103 may be about ¼ times of the infrared wavelength (5 μm). Accordingly, the depression depth h1 of the cavity region may be greater than the height of the infrared sensor 103.

The partition wall 180 may separate the cavity region 150 and the recess region 160 with each other, and may protrude from the lower surface of the upper substrate 120. The partition wall 180 may be disposed to surround the cavity region 150 to provide the cavity 104. A height of the partition wall 180 may be the same as the depression depth h1 of the cavity region 150, and may have a depression depth h2 of the recess region 160.

The depression depth h2 of the recess region 160 may be greater than the depression depth h1 of the cavity region 150, and may range from several micrometers to several hundred micrometers. As the recessed depth h2 of the recess region 160 is increased, a thickness of the upper substrate 120 to be cut may be decreased. A depth difference h2–h1 may be several hundred micrometers. An external connection pad 117 of the sensor substrate 102 may be exposed by cutting the recess region 160.

The upper bonding pad 182 may be disposed on the partition wall 180. The upper bonding pad 182 may perform eutectic bonding. The upper bonding pad 182 may be an alloy of gold (Au), indium (In), copper (Cu), and tin (Sn).

The getter 170 may be disposed in the depressed cavity region 150. The getter 170 may be a metal or a metal alloy. The getter may include at least one of titanium (Ti), zirconium (Zr), iron (Fe), cobalt (Co), aluminum (Al), and vanadium (V). The getter 170 may be maintained in a vacuum state by adsorbing moisture or impurities.

A cut portion 184 may be a portion in which the upper substrate 120 is cut. The cut portion 184 may be disposed in the recess region 160, and may expose the external connection pad 117 disposed on the lower substrate 110. Substrate cutting may be performed using sawing or laser dicing.

The sensor substrate 102 may include the lower substrate 110; an infrared sensor 103 formed on the lower substrate and disposed to face the cavity region 150 of the upper substrate 110; and a lower bonding pad 116 aligned with the upper bonding pad 182 and disposed to surround the infrared sensor 103. Each of the upper substrate 120 and the lower substrate 110 may be a silicon substrate.

The lower substrate 110 may be a silicon substrate. The lower substrate 110 may include a readout integrated circuit (ROIC) driving an infrared sensor. The readout integrated circuit may be a complementary metal-oxide-semiconductor (CMOS). An insulating layer 111 may be disposed on the lower substrate 110 on which the readout integrated circuit is formed.

The insulating layer 111 may insulate the readout integrated circuit and the infrared sensor 103, formed on the lower substrate 110, from each other. The insulating layer 111 may be a silicon oxide layer.

The lower bonding pad 116 may be disposed on the insulating layer 111, and may be disposed to surround the infrared sensor 103. The lower bonding pad 116 may be disposed in a position facing the upper bonding pad 182, and may be coupled to the upper bonding pad 182 to seal the cavity 104. The lower bonding pad 116 may perform eutectic bonding with the upper bonding pad 182. The lower bonding pad 116 may be an alloy of Au, In, Cu, and Sn.

The external connection pad 117 may be disposed outside the lower bonding pad 116, and may perform electrical connection to an external circuit. The external connection pad 117 may be Al, Cu, or an alloy thereof. The external connection pad 117 may include a protective layer on a surface thereof. The protective layer may be titanium (Ti) or titanium nitride (TiN). The protective layer may serve to prevent oxidation and diffusion of the external connection pad 117.

The infrared sensor 103 may include a metal pad 113 formed on an upper surface of the lower substrate 110 to be electrically connected to a readout integrated circuit 110; a reflective layer 112 formed on the upper surface of the lower substrate 110 and reflecting an infrared band; an absorption plate 115 formed to be spaced apart from an upper portion of the reflective layer 112 and absorbing infrared rays to change resistance; and an anchor 118 formed on the metal pad 113 to levitate and support the absorber plate 115 and electrically connecting the metal pad 113 and the absorber plate 115 to each other. The infrared sensor 103 may be a microbolometer. The infrared sensor 103 may include a plurality of unit cells arranged in a matrix form. Each of the unit cells may operate as a single pixel. Each of the unit cells may have a rectangular structure, in a plan view. The absorption plate 115 may be supported to the anchor 118 by a cantilever 119 levitating in the air.

The metal pad 113 may be electrically connected to a readout integrated circuit formed in the lower substrate 110. The metal pad 113 may include a metal layer, formed of a metal such as Al, and a TiN layer as a protective layer, which are sequentially stacked. The metal pad 113 may provide electrical connection, capable of detecting a change in resistance of the absorption plate 115 through the anchor 118.

The reflective layer 112 may be disposed to be spaced apart from the absorption plate 115 with an empty space interposed therebetween, and may reflect infrared rays passing through the absorption plate 115 to be provided again to the absorption plate 115. The reflective layer 112 may be formed of a metal or metal alloy having a thickness greater than or equal to a skin depth. For example, the reflective layer 112 may be formed of aluminum. The thickness of the reflective layer 112 may range from several micrometers to tens of micrometers. The reflective layer 112 has a curved or stepped shape such that a distance between the reflective layer 112 and the absorption plate 115 varies depending on the position of the reflective layer 112. Distances d1 and d2 between the reflective layer 112 and the absorption plate 115 may range 1.5 micrometers to 3 micrometers depending on a position. When the minimum distance d1 between the reflective layer 112 and the absorption plate 115 is 1.5 micrometers, the absorption infrared wavelength may be 6 micrometers. In addition, when the maximum distance d2 between the reflective layer and the absorption plate is 3 micrometers, the absorption infrared wavelength may be 12 micrometers.

An upper surface of the reflective layer 112 may have a depressed curved mirror shape. The curved surface may be a spherical surface or an aspherical surface. When the reflective layer 112 is the spherical mirror, a radius of curvature of the spherical mirror may be more than twice the maximum distance d2 between the reflective layer 112 and the absorption plate 115. Accordingly, a focus of the spherical mirror may be disposed at a sufficiently higher position than the absorption plate 115 to uniformly provide the infrared rays, reflected from the reflective layer 112, to the absorption plate 115.

The protective layer 112b may be disposed on the reflective layer 112 and may prevent oxidation of the reflective layer 112. The protective layer 112b may include a conductive material such as TiN. A thickness of the protective layer 112b may be sufficiently smaller than a thickness of the reflective layer 112.

The absorption plate 115 may be spaced apart from the reflective layer 112 and the protective layer 112b in a levitating state by a predetermined distance "d" or more. The absorption plate 115 may directly absorb externally incident infrared rays, or may absorb infrared rays reflected from the reflective layer 112 after passing through the absorption plate 115. Distances d1 and d2 between the absorption plate 115 and the reflective layer 112 may be ¼ of a wavelength of infrared rays to be reflected. The distances d1 and d2 between the absorption plate 115 and the reflective layer 112 may range from several micrometers to several tens of micrometers depending on the position. A difference between the maximum distance d1 and the maximum distance d2 (d1−d2) may be several micrometers.

The absorption plate 115 may include a first insulating layer 115a, an absorbing layer 115b, a resistive layer 115c, and a second insulating layer 115d sequentially stacked in the form of a rectangular plate.

The first insulating layer 115a may pass through an infrared band and may be an insulator. The first insulating layer 115a may be a silicon nitride layer. A thickness of the first insulating layer 115a may be 150 nm.

As the absorbing layer 115b absorbs infrared rays, a temperature may be increased. The absorbing layer 115b may absorb infrared rays well, and may include a metal material having high thermal conductivity. The absorbing layer 115b may include titanium (Ti), titanium nitride (TiN), or a nickel-chromium (NiCr) alloy. The absorbing layer 115b may be divided in half within a unit cell. Accordingly, resistance of the resistive layer 115c, buried between absorbing layers separated from each other, may vary depending on the temperature. The absorbing layer 115b may have a thickness of 15 nm.

The resistive layer 115c may be a layer having resistance varying depending on a temperature. The resistive layer 115c may include amorphous silicon, single-crystal silicon, vanadium oxide, or silicon-germanium. A thickness of the resistive layer 115c may be 100 nm.

The second insulating layer 115d may protect and insulate the absorbing layer 115c, and may transmit infrared rays. The second insulating layer 115d may be a silicon nitride layer. A thickness of the second insulating layer 115d may be 150 nm.

An anchor 118 may be formed in a columnar shape in an upper portion of the metal pad 113 to separate the absorption plate 115 from the reflective layer 112 by a predetermined distance in a levitating state and to support the absorption plate 115. A lower end of the anchor 118 may be buried in an auxiliary insulating layer 111a. In addition, the anchor 118 may electrically connect the metal pad 113 and the absorption plate 115 to each other. As the absorbing layer 115b absorbs infrared rays, the temperature may be increase and the resistive layer 115c may receive energy from the absorbing layer 115b to change resistance thereof. The resistive layer 115c, connected between the separated absorbing layers 115b in series, may provide a change in resistance. The change in resistance of the resistive layer 115c may be read out in a readout driving circuit through the absorbing layer 115b, the anchor 118, and the metal pad 113.

The anchor 118 may be formed by forming a contact hole 119a and filling the contact hole with a metal or a metal alloy. The anchor 118 may be formed of titanium nitride (TiN) or tungsten (W). When the contact hole 119a is not completely filled with an anchor forming material (for example, TiN), materials forming the absorbing layer 115b, the resistive layer 115c, and a second insulating flayer 115d may each fill the contact hole 119a in a process of forming the absorbing layer 115b, the resistive layer 115c, and the second insulating layer 115d.

A cantilever 119 may connect the absorption plate 115 to each of the anchor 118. The cantilever 119 has the same lamination structure as the absorption plate 115. When the anchor 118 is provided with two anchors and disposed at a pair of vertices of a rectangle, the cantilever 119 may extend along a corner of the absorption plate in a direction of a vertex, in which one anchor is not disposed, to connect the one anchor and a spaced vertex of the absorption plate to each other.

Figure 3:
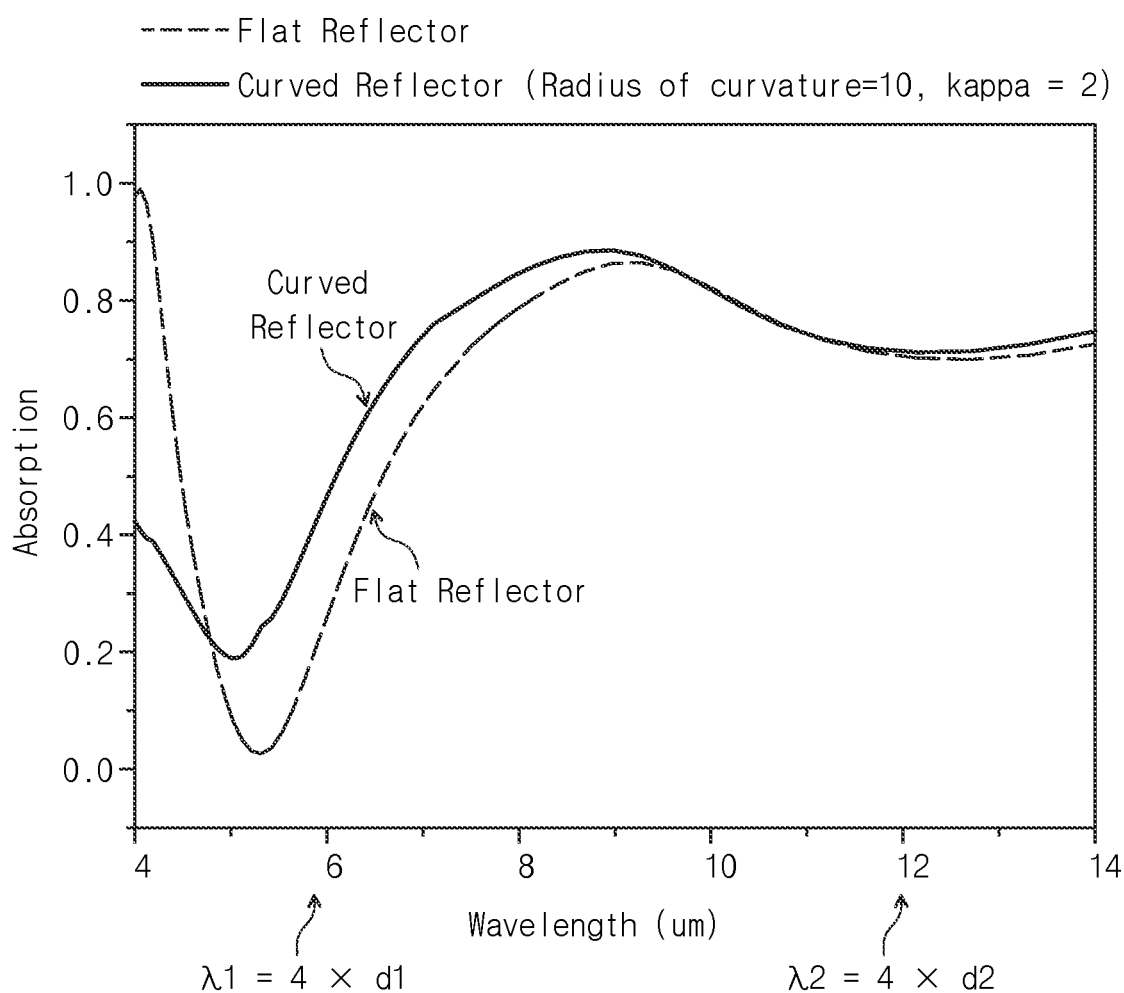
FIG. 3 is a diagram illustrating a result indicating absorption of a MEMS device according to an example embodiment of the present disclosure.

FIG. 3 is a diagram illustrating a result indicating absorption of a MEMS device according to an example embodiment of the present disclosure.

In FIG. 3, a graph shows absorptions in the case in which the reflective layer 112 is a flat surface and in the case in which the reflective layer 112 is a concave curved surface. When the reflective layer 112 is a flat surface, a maximum absorption is about 87% at 5 um to 14 um. On the other hand, when the reflective layer 112 is a concave curved surface, a distance from an absorbing layer to a reflector having a concave curved shape is 2 um (a central portion of the reflector) to 1.3 um (an external portion of the reflector), a conic constant is 2, and a radius of curvature is 10 um, a maximum absorption is 89% at 5 um to 14 um. In addition, it can be seen that in a region of 5 um to 8 um, the absorption is significantly higher than that of a flat mirror, and the absorption is increased even in a long wavelength region of 8 um or more as compared with a flat reflective layer. This is only an example and shows that an absorption of a desired wavelength band may be improved, as compared with an existing flat reflective layer, by appropriately changing a distance between an absorbing layer and a concave reflector, a conic constant, and a radius of curvature.

FIGS. 4A to 4I are cross-sectional views illustrating a method of manufacturing a MEMS device according to an example embodiment of the present disclosure.

Referring to FIGS. 4A to 4I, a method of manufacturing a MEMS device may include: forming an insulating layer 111 on a lower substrate 110; forming a preliminary reflective layer 114 and a metal pad 113 on the insulating layer 111; patterning the preliminary reflective layer 114 to form a reflective layer 112 having a curved or stepped shape; forming a protective layer 113 on the reflective layer 112; and forming an anchor 118, connected to the metal pad 113, and an absorption plate 115 disposed to be spaced apart from the reflective layer 112 and supported by the anchor 118.

The operation of patterning the preliminary reflective layer 114 to form a reflective layer having a curved or stepped shape may include depositing an auxiliary insulating layer on the metal pad 113 and the preliminary reflective layer 114 and patterning the auxiliary insulating layer to form an auxiliary insulating pattern 111a such that the preliminary reflective layer 112 is exposed; and spin-coating a thin film 111b on the auxiliary insulating pattern 111a and the preliminary reflective layer 114 to form a curved shape on the preliminary reflective layer 112.

Figure 4A:
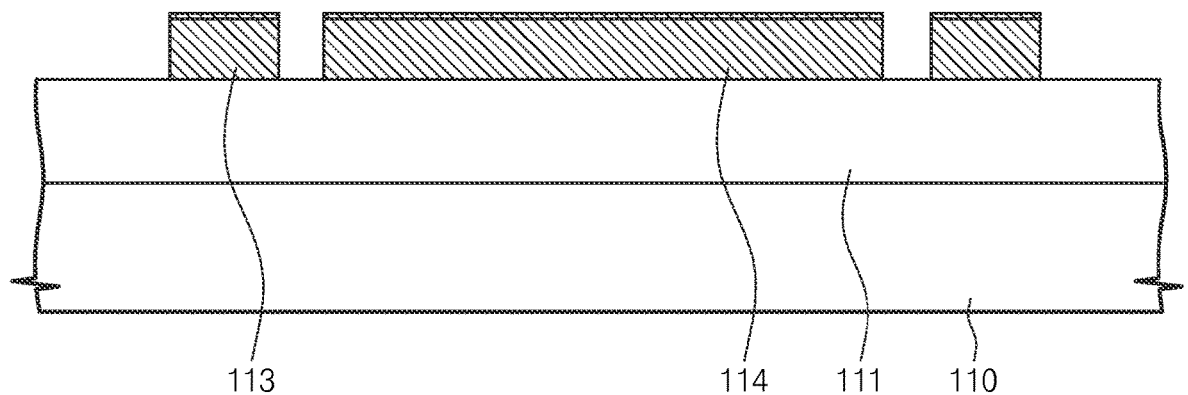
FIGS. 4A to 4I are cross-sectional views illustrating a method of manufacturing a MEMS device according to an example embodiment of the present disclosure.

Referring to FIG. 4A, a readout integrated circuit may be formed on a lower substrate 110. An insulating layer 111 may be formed, as an interlayer insulating layer, on the lower substrate 110 on which the readout integrated circuit is formed. The insulating layer 111 may be a silicon oxide layer.

A preliminary reflective layer 114 and a metal pad 113 may be simultaneously formed on the insulating layer 111 by a patterning process. The preliminary reflective layer 114 and the metal pad 113 may include an adhesive layer, a conductive layer, and a protective layer sequentially stacked. A thickness of the preliminary reflective layer 114 may be several micrometers or more. The adhesive layer may include titanium (Ti). The conductive layer may include aluminum (Al), copper (Cu), or an alloy thereof. The protective layer 112a may include Ti/TiN. The preliminary reflective layer 114 and the metal pad 113 may he patterned through a photolithography process.

Figure 4B:
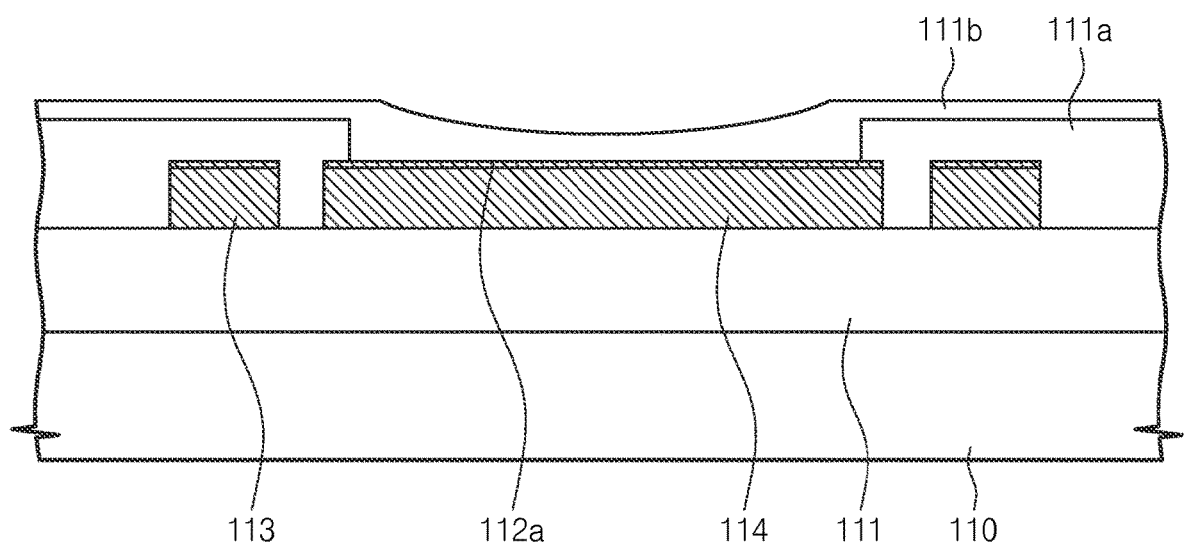

Referring to FIG. 4B, after the preliminary reflective layer 114 and the metal pad 113 are patterned, an auxiliary insulating layer may be deposited on the lower substrate 111 to cover the preliminary reflective layer 114 and the metal pad 113. The auxiliary insulating layer may be planarized through a planarization process. Then, the auxiliary insulating layer may be patterned to expose the preliminary reflective layer 114 and to form an auxiliary insulating pattern 111a.

Then, an organic thin film 111b may be spin-coated on the auxiliary insulating pattern 111a and the preliminary reflective layer 114 to form a curved shape on the preliminary reflective layer 114. The organic thin film 111b may be formed by spin-coating a polymer dissolved in a solvent. The organic thin film 111b may cover a step of the auxiliary insulating pattern 111a in a curved shape. The organic thin film 111b may be a bottom anti-reflective coatings (BARC) material used in a photolithography process. Accordingly, the organic thin film 111b may form a curved surface at the step of the auxiliary insulating pattern 111a. A thickness of the organic thin film 111b may be several micrometers to form a curved surface along the step of the auxiliary insulating pattern 111a.

Figure 4C:
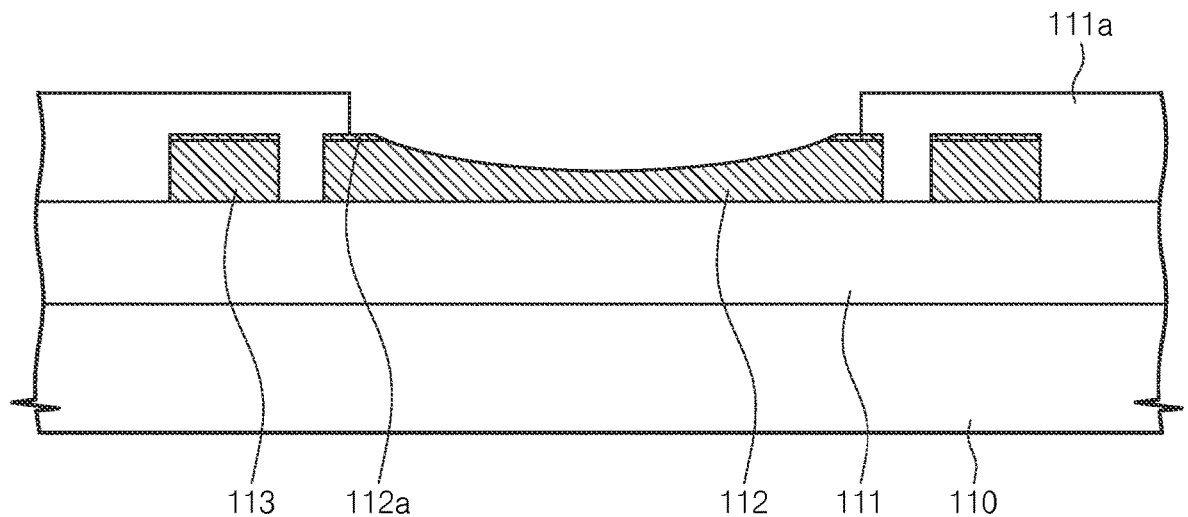

Referring to FIG. 4C, the preliminary reflective layer 114 may be etched by a dry etch-back process under a condition having no selectivity with respect to the organic thin film 111b. Accordingly, the curved shape of the organic thin film 111b may be transferred to the preliminary reflective layer 114 to form the reflective layer 112. Then, a remaining organic thin film 111b may be removed.

Figure 4D:
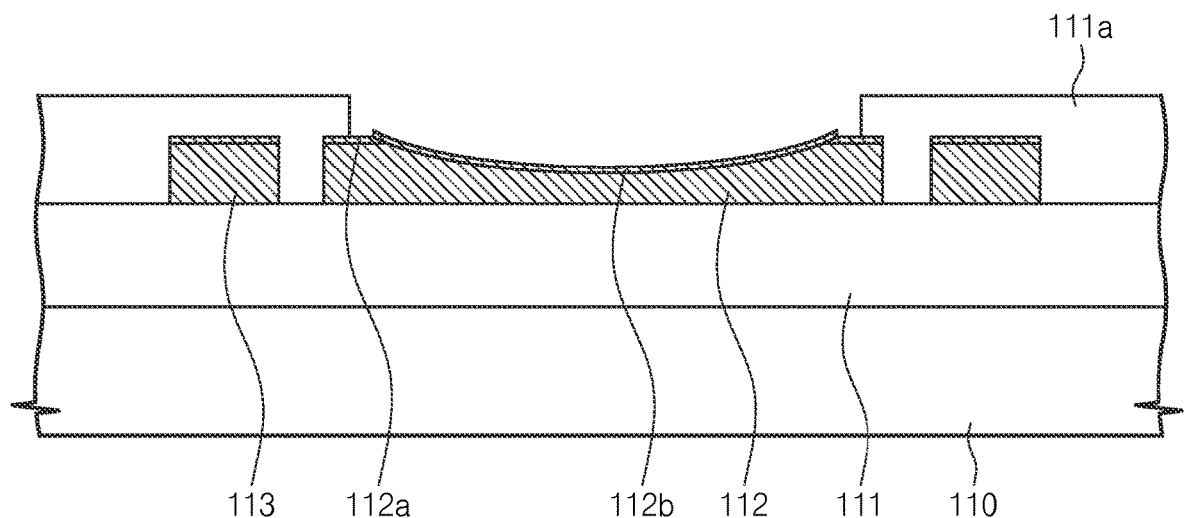

Referring to FIG. 4D, the protective layer 112b may cover the exposed reflective layer 112. The protective layer 112b may be patterned to be disposed only on the reflective layer 112 through a lift-off process or a lithography process after deposition. The protective layer 112b may include titanium nitride (TiN).

Figure 4E:
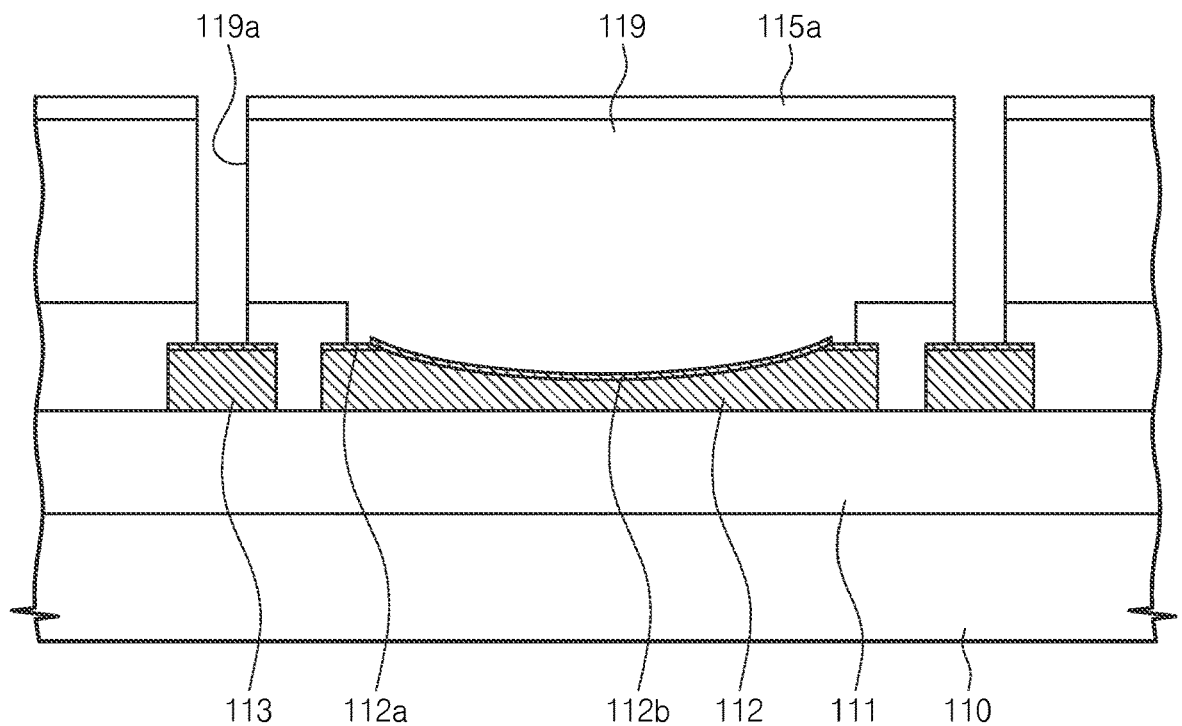

Referring to FIG. 4E, a sacrificial layer 119 may be deposited on the reflective layer 112 and the protective layer 112b. The sacrificial layer 119 will be removed later. The sacrificial layer 119 may be an amorphous carbon layer or polyimide. A thickness of the sacrificial layer 119 may range several micrometers to tens of micrometers. A first insulating layer 115a may be deposited on the sacrificial layer 119. The first insulating layer 115a may be a silicon nitride layer.

The first insulating layer 115a and the sacrificial layer 119A may be patterned to form a contact hole 119a for forming an anchor 118 on the metal pad 113. The contact hole 119a may penetrate through the first insulating layer 115a and the sacrificial layer 119 to expose the metal pad 113.

Figure 4F:
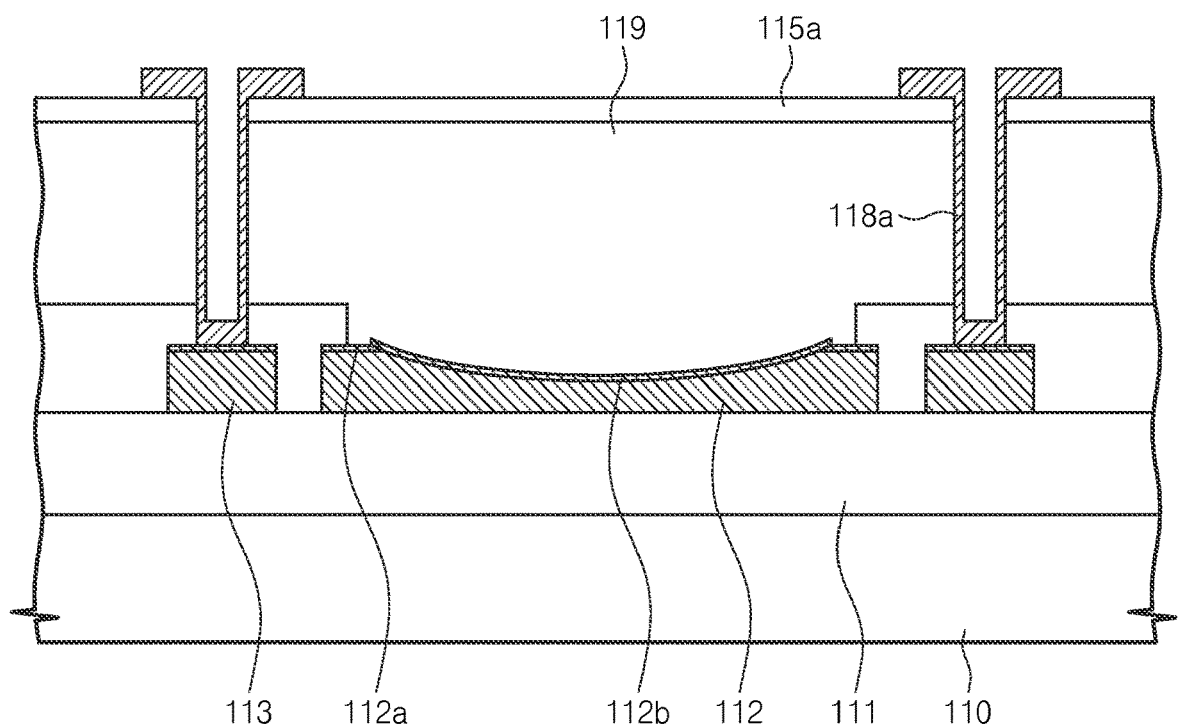

Referring to FIG. 4F, a conductive material forming the anchor 118 may be deposited. The anchor 118 may be TiN or Ti/TiN/W. After deposited, the conductive material may be patterned in the state, in which a contact plug filling the contact hole 119a remains, to form the anchor 118.

Figure 4G:
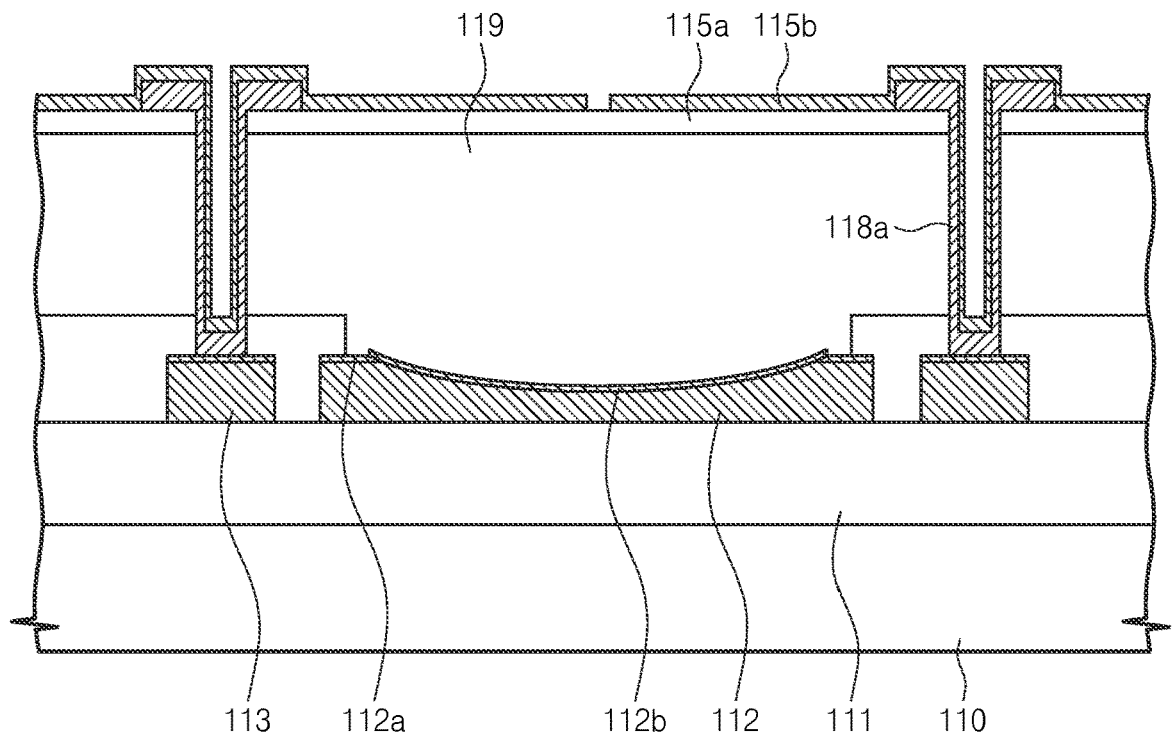

Referring to FIG. 4G, an absorbing layer 115b may be formed to cover the anchor 118 and the first insulating layer 115a. The absorbing layer 115b may be patterned to be separated into two portions in a unit cell. The absorbing layer 115b may include TiN. The absorbing layer 115b may be deposited on an internal surface of the anchor 118.

Figure 4H:
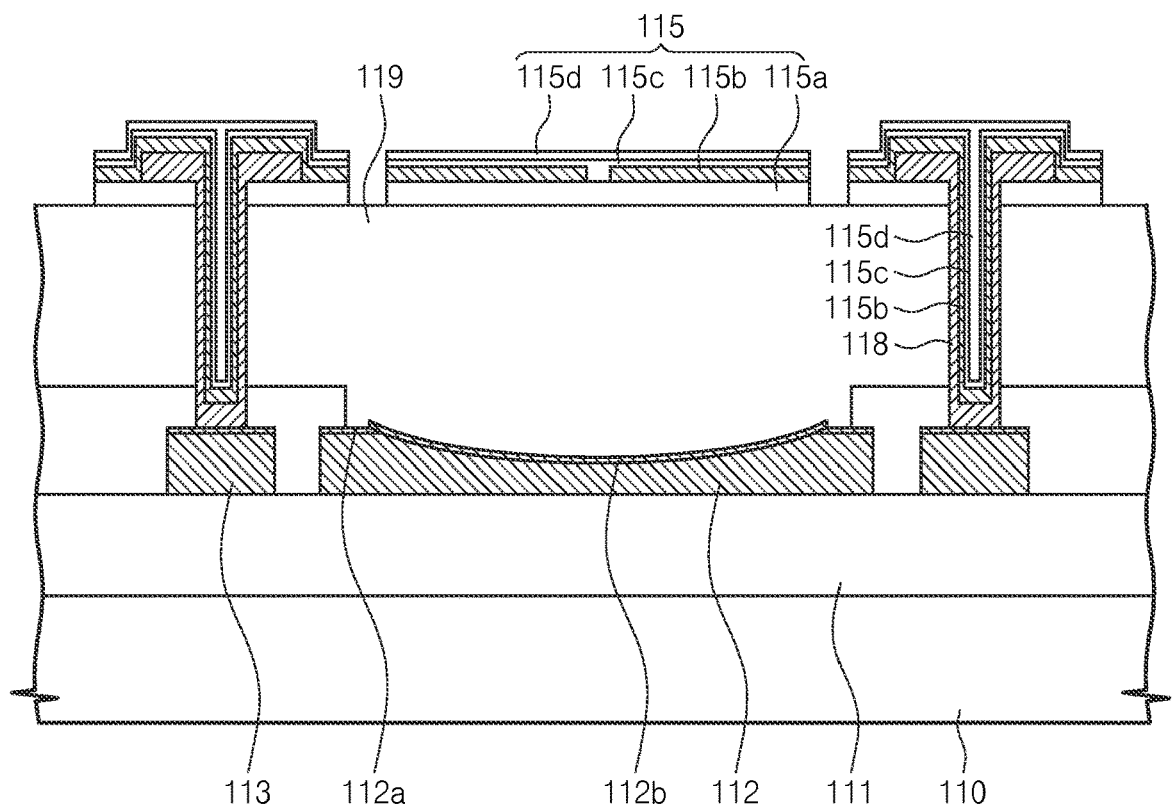

Referring to FIG. 4H, a resistive layer 115c and a second insulating layer 115d may be sequentially formed on the absorbing layer 115b. The inside of the anchor 118 may be filled with the absorbing layer 115b, the resistive layer 115c, and the second insulating layer 115d. Accordingly, the anchor 118 may include the absorbing layer 115b, the resistive layer 115c, and the second insulating layer 115d. The resistive layer 115c may include amorphous silicon, single-crystal silicon, vanadium oxide, or silicon-germanium. The second insulating layer 115d may be a silicon nitride layer.

The first insulating layer 115a, the absorbing layer 115b, the resistive layer 115c, and the second insulating layer 115d may be etched through a photolithography process to expose the sacrificial layer 119 and to form the absorption plate 115.

Figure 4I:
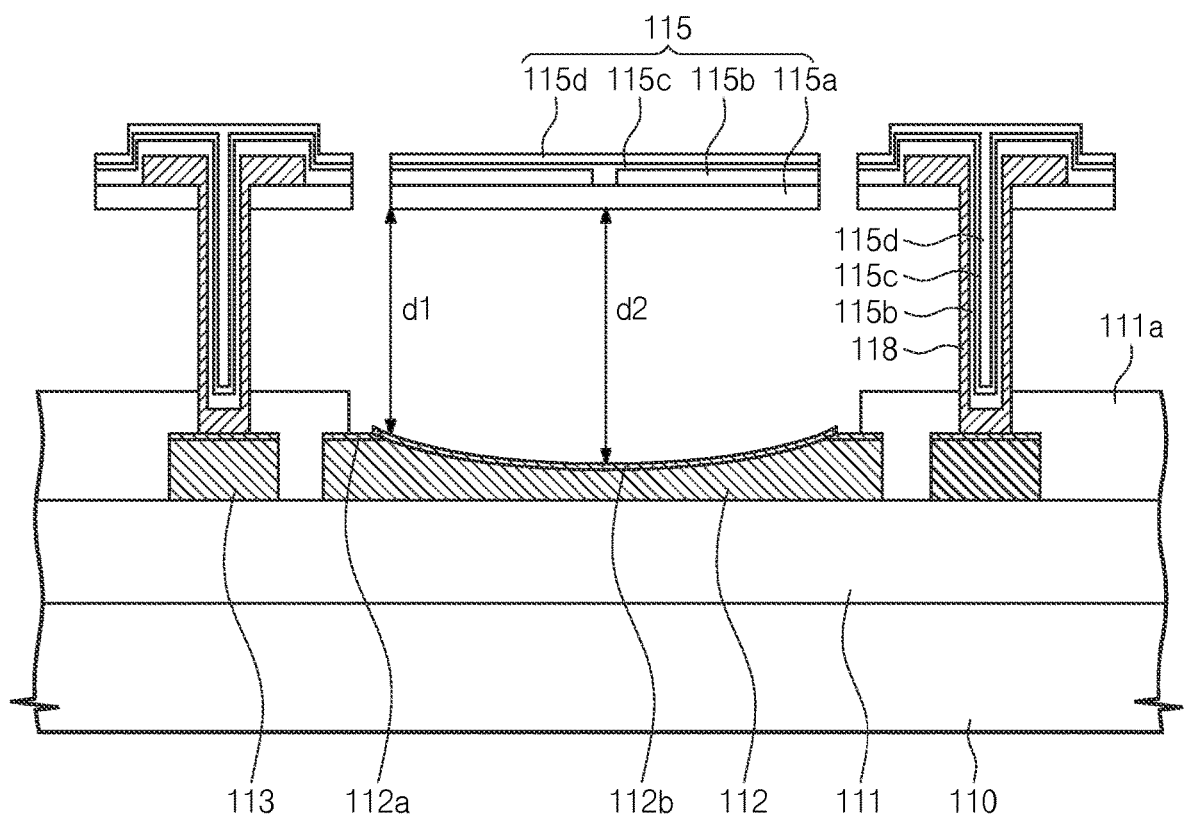

Referring to FIG. 4I, the sacrificial layer 119 may be removed through dry etching or wet etching. Accordingly, the reflective layer may have a depressed curved mirror shape. A distance between the reflective layer and the absorption plate in a central portion of the reflective layer may vary depending on a position, and a high absorption may be provided for a wide wavelength range.

Figure 5:
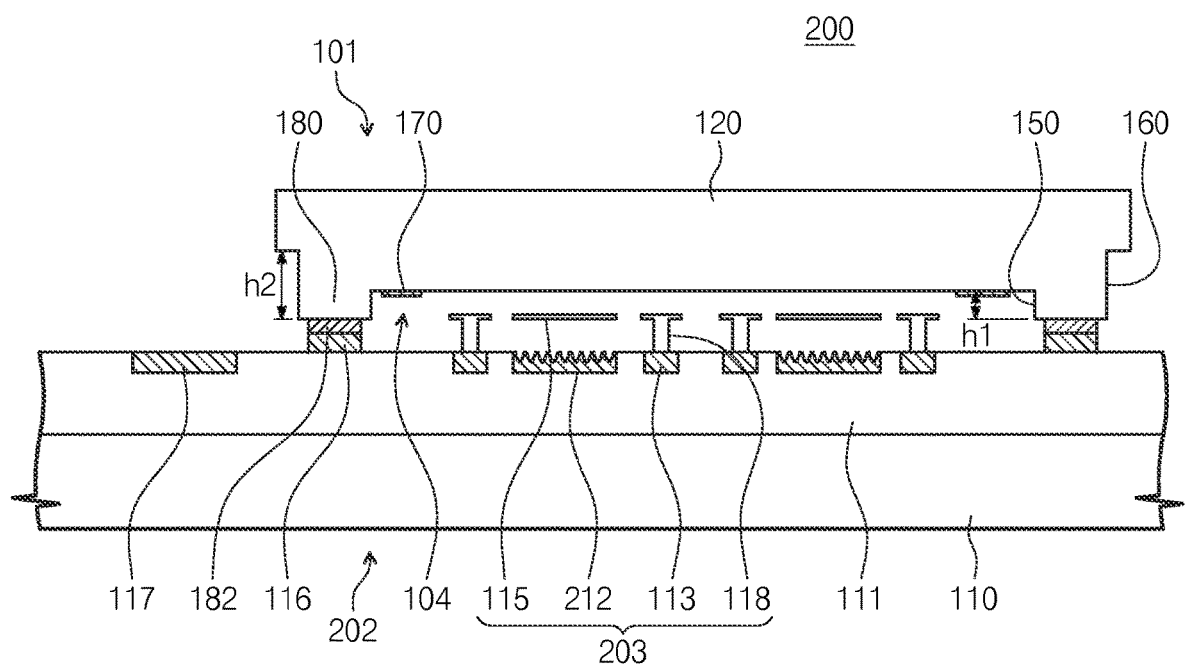
FIG. 5 is a conceptual diagram of a MEMS device according to another example embodiment of the present disclosure.

FIG. 5 is a conceptual diagram of a MEMS device according to another example embodiment of the present disclosure.

Referring to FIG. 5, a MEMS device 200 may include a sensor substrate 202 provided with an infrared sensor 203 and a cap substrate 101 wafer-bonded to the sensor substrate 202 to constitute a cavity 104.

The sensor substrate 202 may include a lower substrate 110; an infrared sensor 203 formed on the lower substrate 110 and disposed to face a cavity region 150 of the upper substrate 120; and a lower bonding pad 116 aligned with the upper bonding pad 182 and disposed to surround the infrared sensor 203. Each of the upper substrate 120 and the lower substrate 110 may be a silicon substrate.

The infrared sensor 203 may include a metal pad 113 formed on an upper surface of the lower substrate 110 to be electrically connected to a readout integrated circuit; a reflective layer 212 formed on an upper surface of the lower substrate 110 and reflecting an infrared band; an absorption plate 115 formed to be spaced apart from an upper portion of the reflective layer and absorbing infrared rays to change resistance; and an anchor 118 formed in an upper portion of the metal pad 113 to levitate and support the absorption plate 115 and to electrically connect the metal pad 113 and the absorption plate 115 to each other. The infrared sensor 203 may be a microbolometer. The infrared sensor 203 may include a plurality of unit cells arranged in a matrix form. Each of the unit cells may operate as a single pixel. Each of the unit cells may have a rectangular structure in a plan view. The absorption plate 115 may levitate in the air and may be supported to the anchor 118 by a cantilever 119.

The reflective layer 212 may include a plurality of curved holes such that a distance between the reflective layer 212 and the absorption plate 115 varies depending on a position of the reflective layer 112. Distances d1 and d2 between the reflective layer 212 and the absorption plate 115 may range from 1.5 micrometers to 3 micrometers depending on a position. When the minimum distance d1 between the reflective layer and the absorption plate is 1.5 micrometers, an absorption infrared wavelength may be 6 micrometers. In addition, when a maximum distance d2 between the reflective layer and the absorption plate is 3 micrometers, the absorption infrared wavelength may be 12 micrometers.

An upper surface of the reflective layer 212 may have a plurality of depressed curved mirrors. The curved surface may be a spherical surface or an aspherical surface. When the reflective layer 212 is the spherical mirror, a radius of curvature of the spherical mirror may be more than twice the maximum distance d2 between the reflective layer 212 and the absorption plate 115. Accordingly, a focus of the spherical mirror is disposed in a position sufficiently higher than a position of the absorption plate 115, so that infrared rays reflected from the reflective layer 212 may be uniformly provided to the absorption plate 115.

The protective layer 212b may be conformally disposed on the reflective layer 212, and may prevent oxidation of the reflective layer 212. The protective layer 212b may include a conductive material and may be formed of titanium nitride (TiN). A thickness of the protective layer 212b may be sufficiently smaller than that of the reflective layer 212.

FIGS. 6A to 6D are cross-sectional views illustrating a method of manufacturing a MEMS device according to another example embodiment of the present disclosure.

Referring to FIGS. 6A to 6D, a method of manufacturing a MEMS device 200 may includes: forming an insulating layer 111 on a lower substrate 110; forming a preliminary reflective layer 214 and a metal pad 113 on the insulating layer 111; patterning the preliminary reflective layer 214 to form a reflective layer 212 having a curved or stepped shape; forming a protective layer 212b on the reflective layer 212; and forming an anchor 118, connected to the metal pad 113, and an absorption plate 115 disposed to be spaced apart from the reflective layer 212 and supported by the anchor 118.

The operation of patterning the preliminary reflective layer 214 to form a reflective layer 212 having a curved or stepped shape may includes depositing an auxiliary insulating layer on the metal pad 113 and patterning the auxiliary insulating layer 214 to form an auxiliary insulating pattern 111a such that the preliminary reflective layer 214 is exposed; forming a photoresist thin film on the auxiliary insulating pattern 111a and the preliminary reflective layer 214 and exposing the photoresist thin film to form a photoresist pattern 211a having a depressed curved shape; and dry-etching the photoresist pattern 211a and the preliminary reflective layer 214 to form a reflective layer 212 having a depressed curved shape.

Figure 6A:
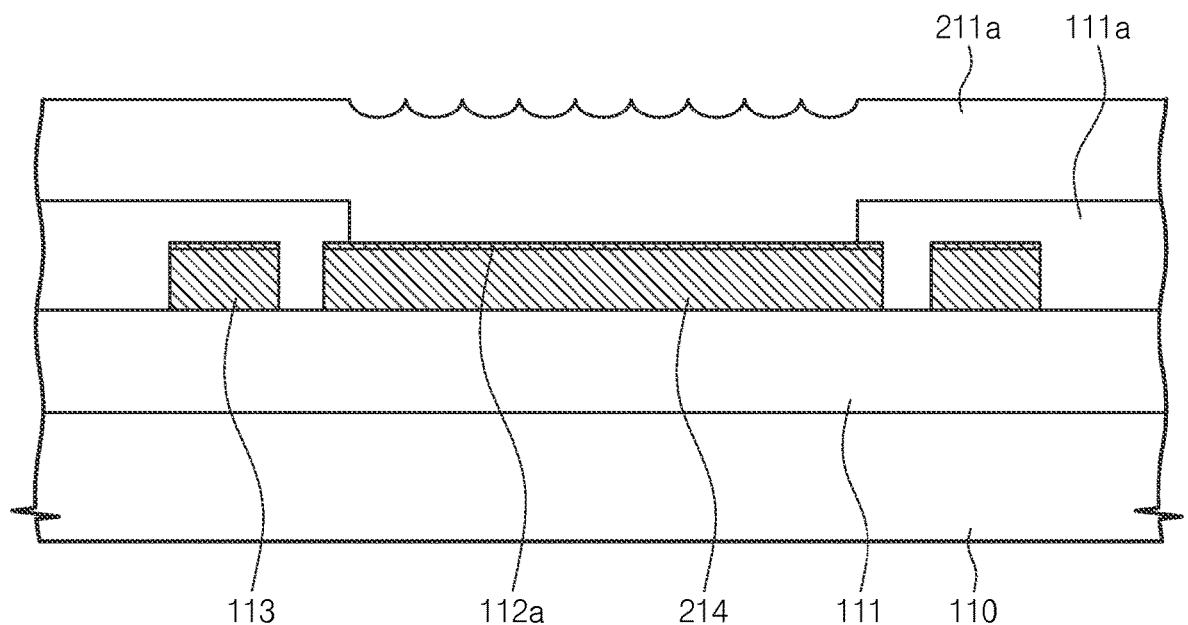
FIGS. 6A to 6D are cross-sectional views illustrating a method of manufacturing a MEMS device according to another example embodiment of the present disclosure.

Referring to FIG. 6A, a readout integrated circuit may be formed on the lower substrate 110. An insulating layer 111 may be formed, as an interlayer insulating layer, on the lower substrate 110 on which the readout integrated circuit is formed. The insulating layer 111 may be a silicon oxide layer.

A preliminary reflective layer 214 and a metal pad 113 may be simultaneously formed on the insulating layer 111 by a patterning process. The preliminary reflective layer 214 and the metal pad 113 may include an adhesive layer, a conductive layer, and a protective layer sequentially stacked. A thickness of the preliminary reflective layer 214 may be several micrometers or more. The adhesive layer may include titanium (Ti). The conductive layer may include aluminum (Al), copper (Cu), or an alloy thereof. The protective layer 112a may include Ti/TiN. The preliminary reflective layer 214 and the metal pad 113 may be patterned through a photolithography process.

After the preliminary reflective layer 214 and the metal pad 113 are patterned, an auxiliary insulating layer may be deposited on the lower substrate 111 to cover the preliminary reflective layer 214 and the metal pad 113. The auxiliary insulating layer may be planarized through a planarization process. Then, the auxiliary insulating layer may be patterned to expose the preliminary reflective layer 214 and form an auxiliary insulating pattern 111a.

Then, a photoresist layer may be formed on the auxiliary insulating pattern 111a and the preliminary reflective layer 114. The photoresist layer may form a photoresist pattern 211a having a plurality of curved holes using a photolithography technique. The curved holes may be formed through a thermal reflow process after forming a plurality of holes through a normal exposure process. Alternatively, the plurality of curved holes may be formed through an exposure process having lower light intensity than normal exposure process conditions.

Figure 6B:
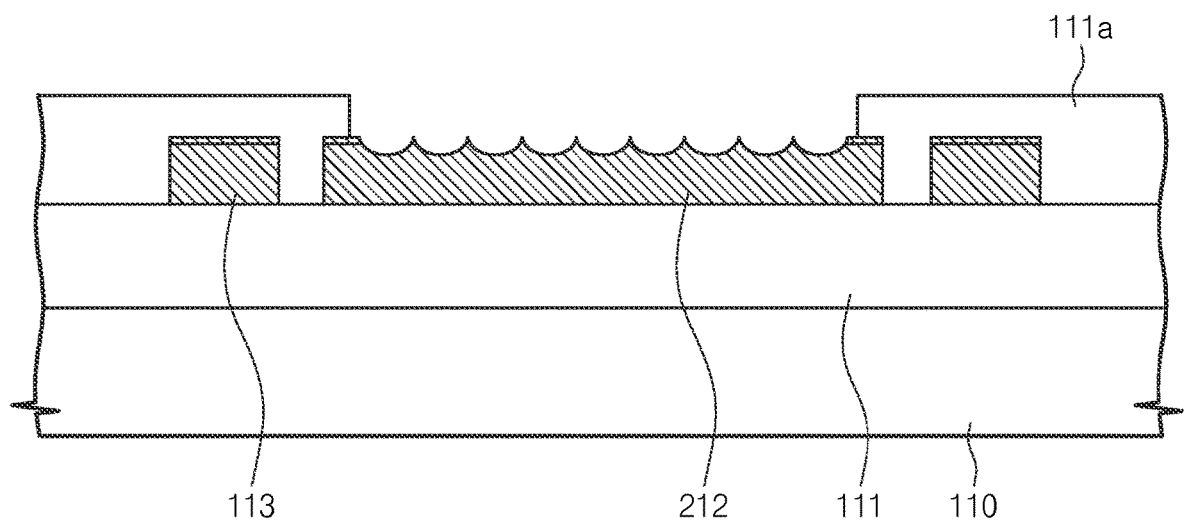

Referring to FIG. 6B, the preliminary reflective layer 114 may be etched by an etch-back dry etching process under a condition having no selectivity with respect to the photoresist pattern 211b. Accordingly, the curved shape of the photoresist pattern 211b may be transferred to the preliminary reflective layer 214 to form a reflective layer 212. Then, a remaining photoresist pattern 211a may be removed.

Figure 6C:
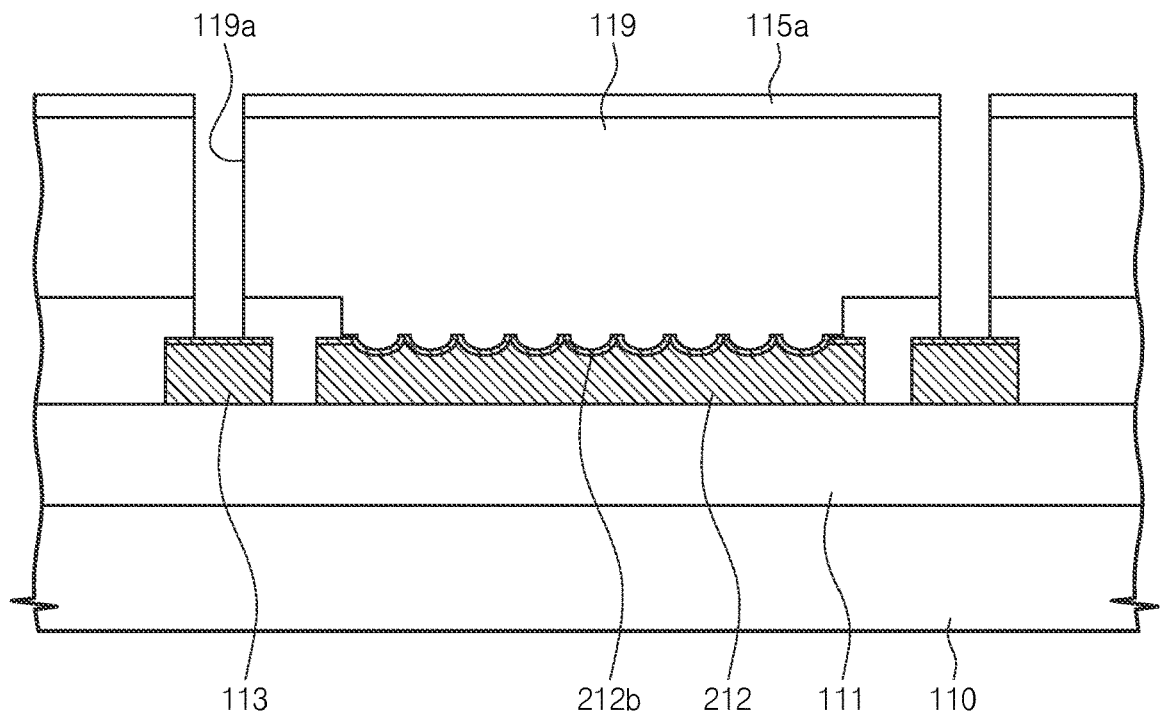

Referring to FIG. 6C, a protective layer 212b may cover the exposed reflective layer 212. The protective layer 212b may be patterned to be disposed only on the reflective layer 212 through a lift-off process or a lithography process after deposition. The protective layer 212b may include titanium nitride (TiN).

A sacrificial layer 119 may be deposited on the reflective layer 212 and the protective layer 212b. The sacrificial layer 119 will be removed later. The sacrificial layer 119 may include an amorphous carbon layer or polyimide. A thickness of the sacrificial layer 119 may range from several micrometers to tens of micrometers. A first insulating layer 115a may be deposited on the sacrificial layer 119. The first insulating layer 115a may be a silicon nitride layer.

The first insulating layer 115a and the sacrificial layer 119 may be patterned to form a contact hole 119a for forming an anchor 118 on the metal pad 113. The contact hole 119a may penetrate through the first insulating layer 115a and the sacrificial layer 119 to expose the metal pad 113.

A conductive material, forming the anchor 118, may be deposited. The anchor 118 may be TiN or Ti/TiN/W. After the conductive material is deposited, the conductive material may be patterned, in the state in which a contact plug filling the contact hole 119a remains, to form the anchor 118.

Figure 6D:
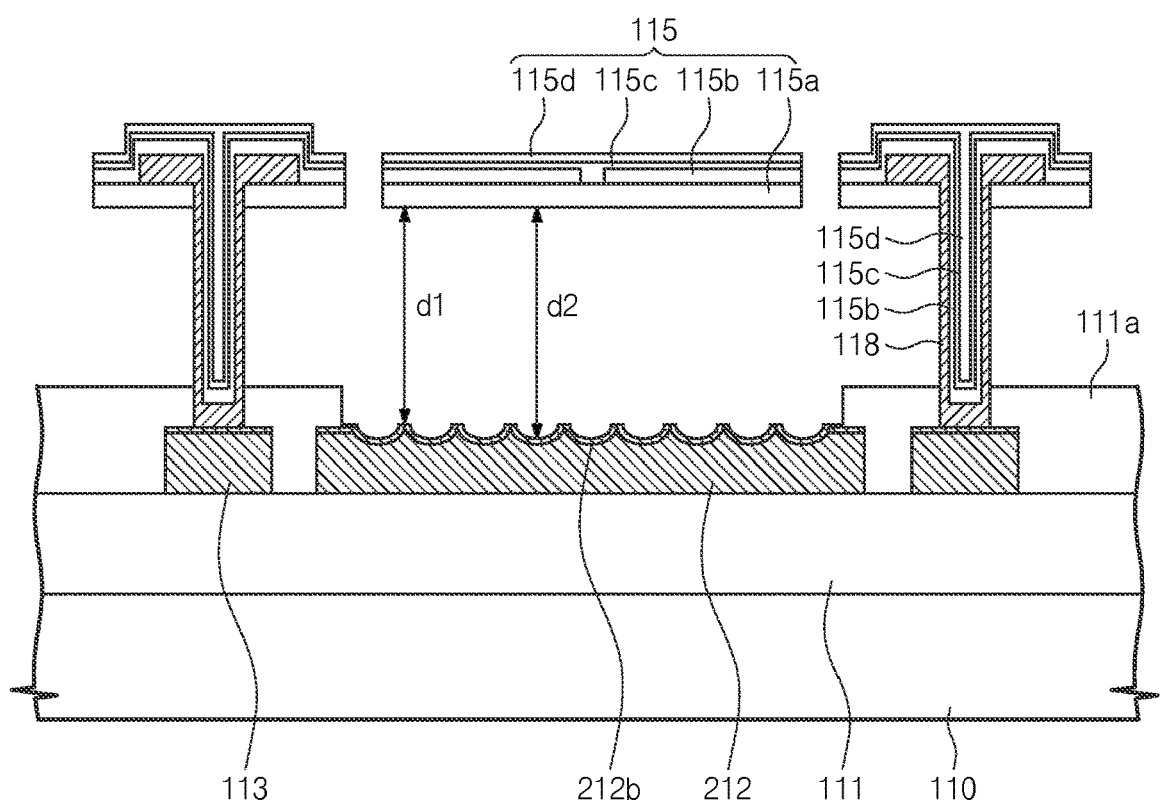

Referring to FIG. 6D, an absorbing layer 115b may be formed to cover the anchor 118 and the first insulating layer 115a. The absorbing layer 115b may be patterned to be separated into two portions in a unit cell. The absorbing layer 115b may include titanium nitride (TiN). The absorbing layer 115b may be deposited on an internal surface of the anchor 118.

A resistive layer 115c and a second insulating layer 115d may be sequentially formed on the absorbing layer 115b. The inside of the anchor 118 may be filled with the absorbing layer 115b, the resistive layer 115c, and the second insulating layer 115d. Accordingly, the anchor 118 may include the absorbing layer 115b, the resistive layer 115c, and the second insulating layer 115d.

The first insulating layer 115a, the absorbing layer 115b, the resistive layer 115c, and the second insulating layer 115 may be are etched through a photolithography process to expose the sacrificial layer 119 and to form the absorption plate 115.

The sacrificial layer 119 may be removed through dry etching or wet etching. Accordingly, the reflective layer may have a depressed curved mirror shape. A distance d2 between the reflective layer and the absorption plate in a central portion of the reflective layer may be maximum. A distance d1 between the reflective layer and the absorption plate in an edge of the reflective layer may be minimum.

Figure 7:
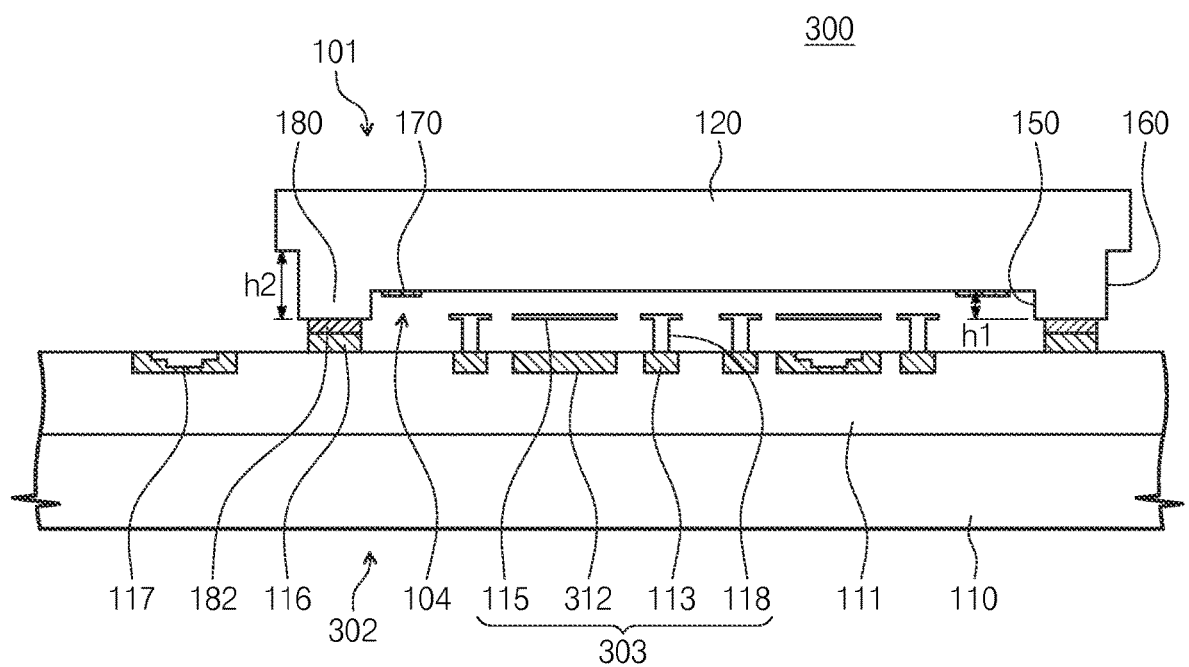
FIG. 7 is a conceptual diagram of a MEMS device according to another example embodiment of the present disclosure.

FIG. 7 is a conceptual diagram of a MEMS device according to another example embodiment of the present disclosure.

Referring to FIG. 7, a MEMS device 300 may include a sensor substrate 302 having an infrared sensor 303; and a cap substrate 101 wafer-bonded to the sensor substrate 302 to constitute the cavity 104.

The sensor substrate 302 may include a lower substrate 110; an infrared sensor 303 formed on thelower substrate 110 and disposed to face a cavity region 150 of an upper substrate 120; and a lower bonding pad 116 aligned with the upper bonding pad 182 and disposed to surround the infrared sensor 303. Each of the upper substrate 120 and the lower substrate 110 may be a silicon substrate.

The infrared sensor 303 may include a metal pad 113 formed on an upper surface of the lower substrate 110 to be electrically connected to a readout integrated circuit; a reflective layer 312 formed on an upper surface of the lower substrate and reflecting an infrared band; an absorption plate 115 formed to be spaced apart from an upper portion of the reflective layer and absorbing infrared rays to change resistance; and an anchor 118 formed on the metal pad 113 to levitate and support the absorption plate 115 and to electrically connect the metal pad 113 and the absorption plate 115 to each other. The infrared sensor 303 may be a microbolometer. The infrared sensor 303 may include a plurality of unit cells arranged in a matrix form. Each of the unit cells may operate as a single pixel. Each of the unit cells may have a rectangular structure in a plan view. The absorption plate 115 may levitate in the air and may be supported to the anchor 118 by a cantilever 119.

The reflective layer 312 may include a stepped shape having a plurality of steps such that a distance between the reflective layer 312 and the absorption plate 115 varies depending on a position of the reflective layer 312. Distances d1 and d2 between the reflective layer 312 and the absorption plate 115 may range from 1.5 micrometers to 3 micrometers depending on a position. When the minimum distance d1 between the reflective layer and the absorption plate is 1.5 micrometers, an absorption infrared wavelength may be 6 micrometers. In addition, when the maximum distance d2 between the reflective layer and the absorption plate is 3 micrometers, the absorption infrared wavelength may be 12 micrometers. An upper surface of the reflective layer 212 may have a plurality of depressed stepped mirrors.

A protective layer 212b may be conformally disposed on the reflective layer 212, and may prevent oxidation of the reflective layer 212. The protective layer 212b may include a conductive material and may be formed of titanium nitride (TiN). A thickness of the protective layer 212b may be sufficiently smaller than a thickness of the reflective layer 212.

FIGS. 8A to 8F are cross-sectional views illustrating a method of manufacturing a MEMS device according to another example embodiment of the present disclosure.

Referring to FIGS. 8A to 8F, a method of manufacturing the MEMS device 300 may includes: forming an insulating layer 111 on a lower substrate 110; forming a preliminary reflective layer 314 and a metal pad 113 on the insulating layer 111; patterning the preliminary reflective layer 314 to form a reflective layer 312 having a curved or stepped shape; forming a protective layer 312b on the reflective layer 312; and forming an anchor 118, connected to the metal pad 113, and an absorption plate 115 disposed to be spaced apart from the reflective layer 312 and supported by the anchor 118.

The operation of patterning the preliminary reflective layer 314 to form a reflective layer having a curved or stepped shape may include depositing an auxiliary insulating layer on the metal pad 113 and patterning the auxiliary insulating layer to form an auxiliary insulating pattern 111a such that the preliminary reflective layer 314 is exposed; forming a first photoresist pattern 311a to expose a portion of the preliminary reflective layer 314 and etching the preliminary reflective layer 314 to form a depressed reflective layer 312a; and forming a second photoresist pattern 311b expose the depressed reflective layer 312a and a portion of a preliminary reflective layer around the depressed reflective layer 312a and etching the depressed reflective layer 312a to form a reflective layer 312 having a stepped structure.

Figure 8A:
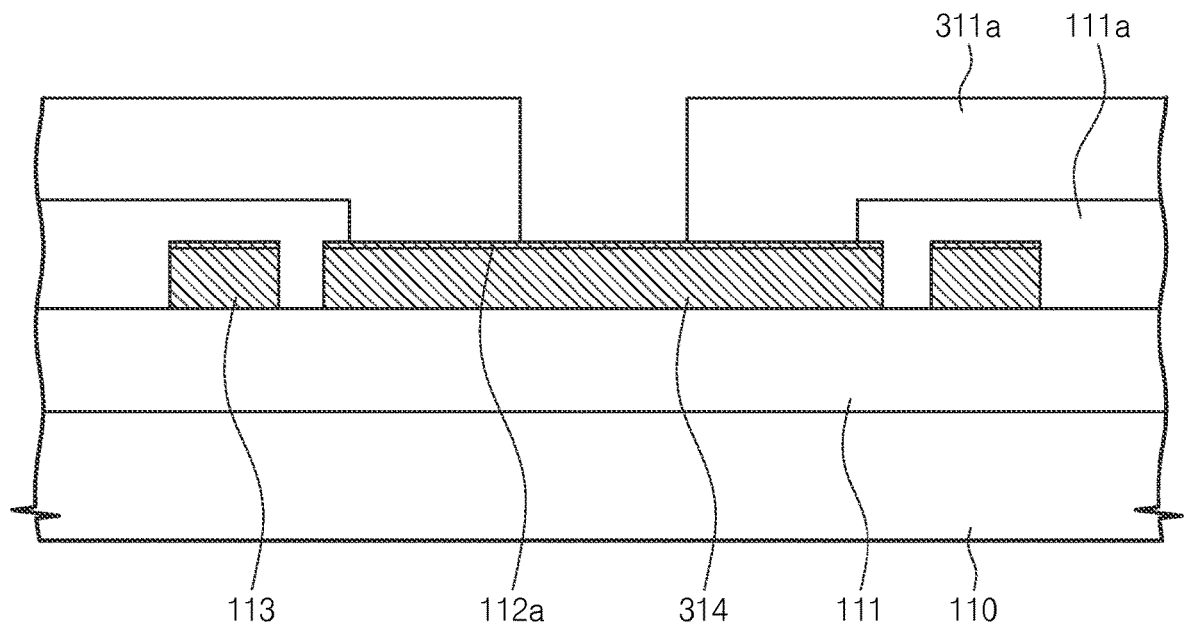
FIGS. 8A to 8F are cross-sectional views illustrating a method of manufacturing a MEMS device according to another example embodiment of the present disclosure.

Referring to FIG. 8A, a readout integrated circuit may be formed on a lower substrate 110. An insulating layer 111 may be formed, as an interlayer insulating layer, on the lower substrate 110 on which the readout integrated circuit is formed. The insulating layer 111 may be a silicon oxide layer.

The preliminary reflective layer 314 and the metal pad 113 may be simultaneously formed on the insulating layer 111 by a patterning process. The preliminary reflective layer 314 and the metal pad 113 may include an adhesive layer, a conductive layer, and a protective layer sequentially stacked. A thickness of the preliminary reflective layer 314 may be several micrometers or more. The adhesive layer may include titanium (Ti). The conductive layer may be aluminum (Al), copper (Cu), or an alloy thereof. The protective layer 112a may include Ti/TiN. The preliminary reflective layer 314 and the metal pad 113 may be patterned through a photolithography process.

After the preliminary reflective layer 314 and the metal pad 113 are patterned, an auxiliary insulating layer may be deposited on the lower substrate 111 to cover the preliminary reflective layer 314 and the metal pad 113. The auxiliary insulating layer may be planarized through a planatization process. Then, the auxiliary insulating layer may be patterned to expose the preliminary reflective layer 314 and to form an auxiliary insulating pattern 111a.

Then, a photoresist layer may be formed on the auxiliary insulating pattern 111a and the preliminary reflective layer 314. The photoresist layer may form a first photoresist pattern 311a, exposing a portion of the preliminary reflective layer 314, using a photolithography technique.

Figure 8B:
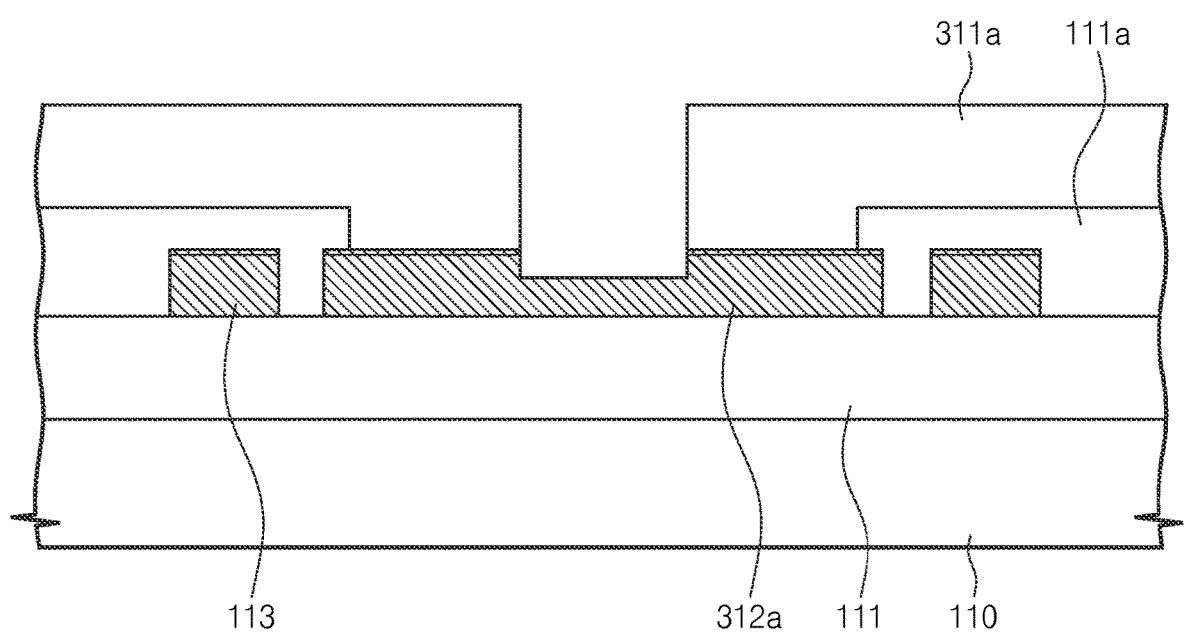
Figure 8C:
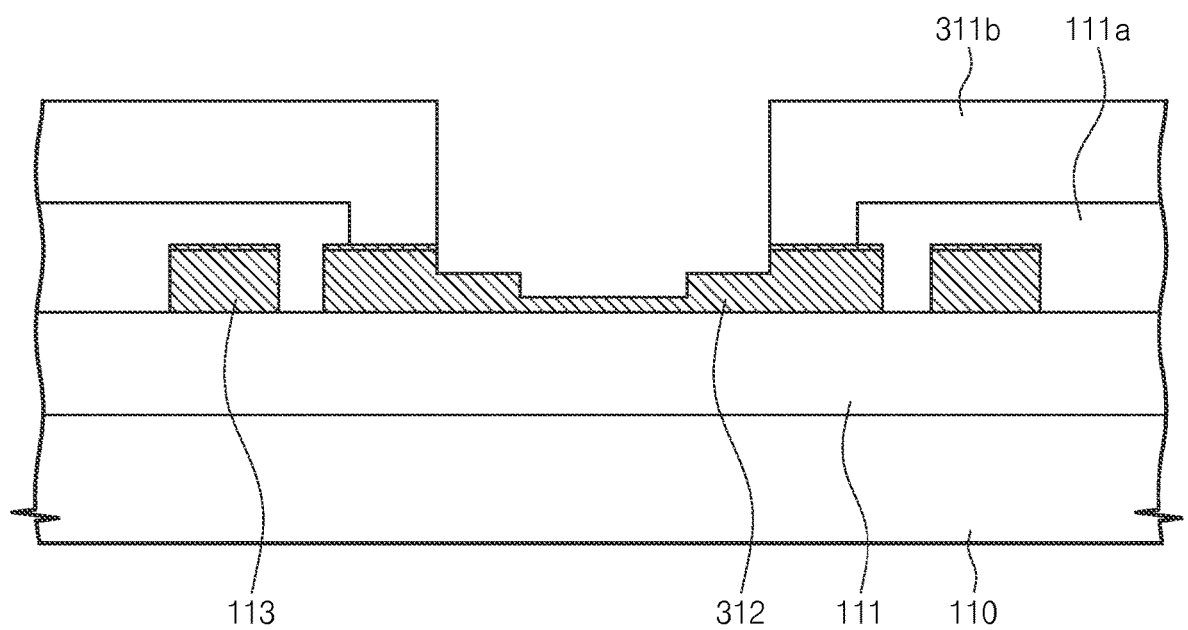

Referring to FIG. 8B, the preliminary reflective layer may be etched by a dry etching process under a condition having a high selectivity with respect to the first photoresist pattern 311a. Accordingly, a depressed preliminary reflective layer 312a may be formed, Referring to FIG. 8C, the first photoresist pattern 311a may be removed and a second photoresist pattern 311b may be formed through a new lithography process. The second photoresist pattern 311b may expose a depressed portion of the depressed preliminary reflective layer 312a and a non-depressed area around the recessed preliminary reflective layer 312a. The recessed preliminary reflective layer 312a may be etched by a dry etching process under a condition having a high selectivity with respect to the second photoresist pattern 311b. Accordingly, the reflective layer 312 may be formed. Then, the second photoresist pattern 311b may be removed.

Figure 8D:
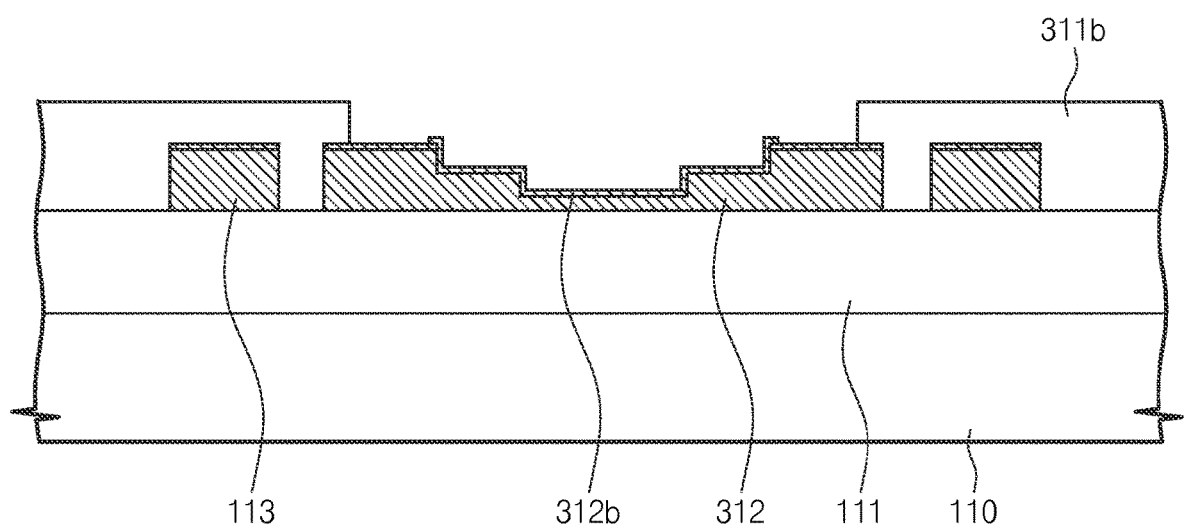

Referring to FIG. 8D, the protective layer 312b may be formed to cover the exposed reflective layer 212. The protective layer 312b may be patterned to be disposed only on the reflective layer 312 through a lift-off process or a lithography process after deposition. The protective layer 312b may include titanium nitride (TiN).

Figure 8E:
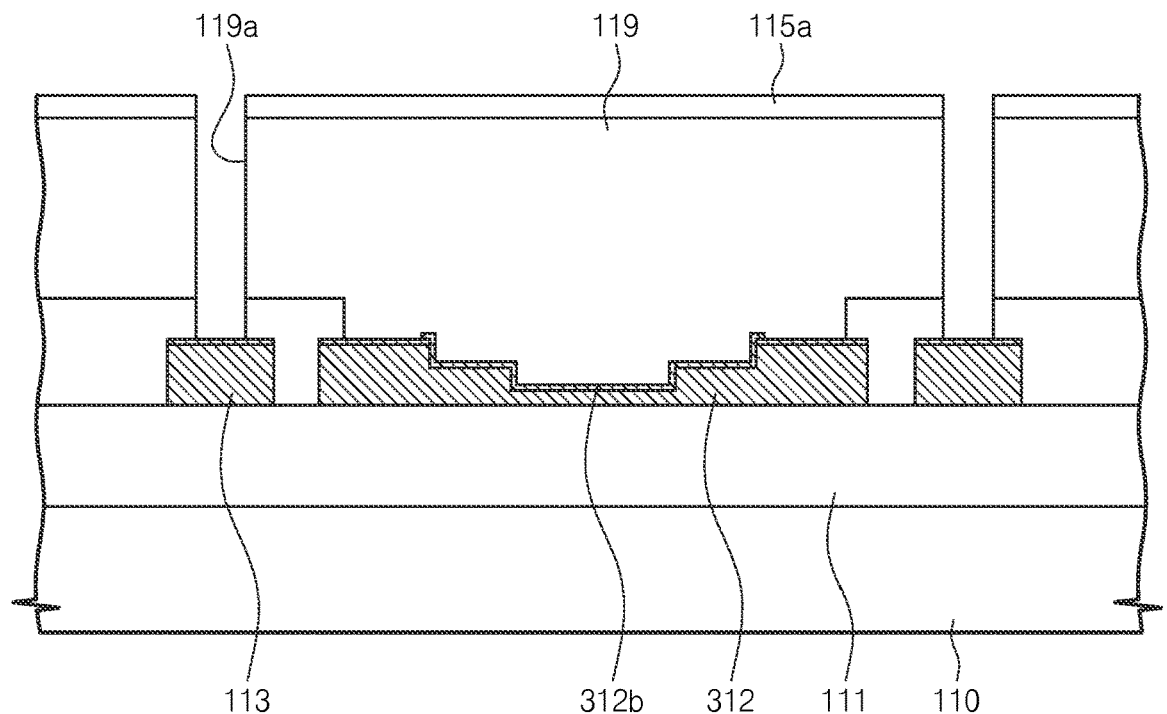

Referring to FIG. 8E, a sacrificial layer 119 may be deposited on the reflective layer 312 and the protective layer 312b. The sacrificial layer 119 will be removed later. The sacrificial layer 119 may include an amorphous carbon layer or polyimide. A thickness of the sacrificial layer 119 may range from several micrometers to tens of micrometers. A first insulating layer 115a may be deposited on the sacrificial layer 119. The first insulating layer 115a may be a silicon nitride layer.

The first insulating layer 115a and the sacrificial layer 119 may be patterned to form a contact hole 119a for forming an anchor 118 on the metal pad 113. The contact hole 119a may penetrate through the first insulating layer 115a and the sacrificial layer 119 to expose the metal pad 113.

Figure 8F:
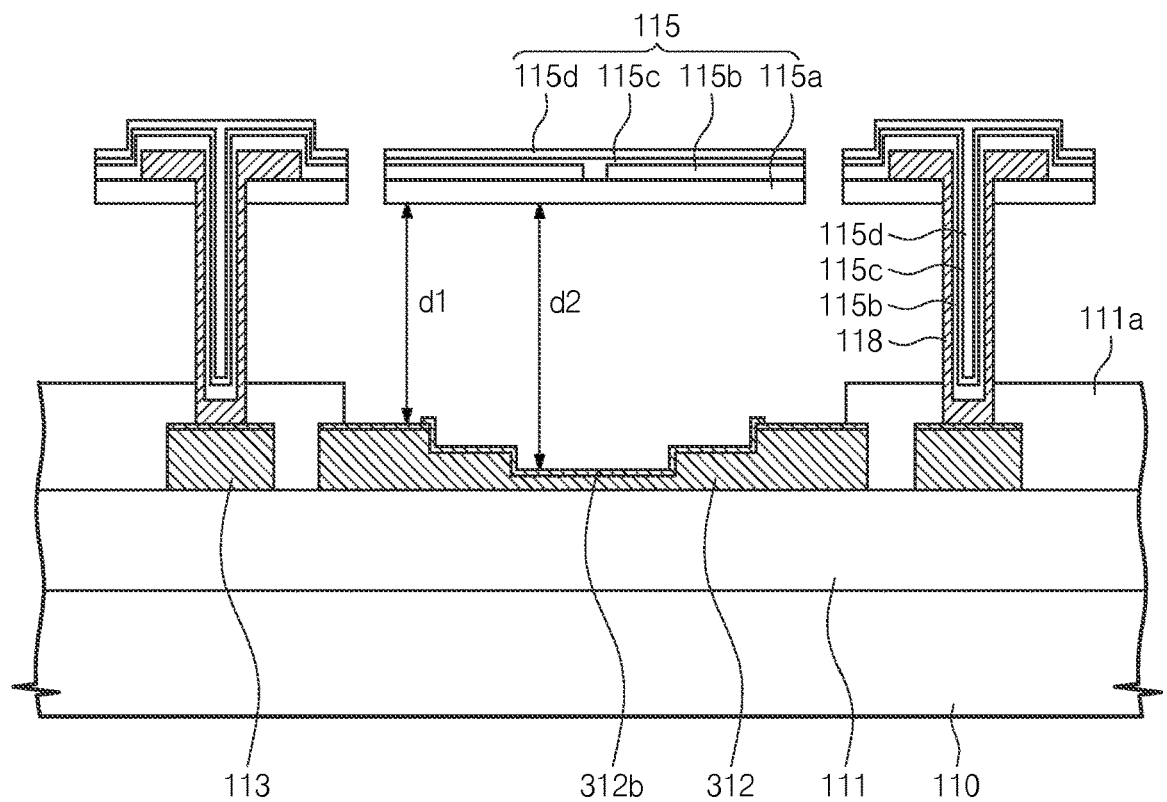

Referring to FIG. 8F, a conductive material forming the anchor 118 may be deposited. The anchor 118 may include TiN or Ti/TiN/W. After the conductive material is deposited, the conductive material may be patterned, in the state in which a contact plug filling the contact hole 119a remains, to form the anchor 118.

The absorbing layer 115b may be formed to cover the anchor 118 and the first insulating layer 115a. The absorbing layer 115b may be patterned to be separated into two portions in a unit cell. The absorbing layer 115b may include titanium nitride (TiN). The absorbing layer 115b may be deposited on an internal surface of the anchor 118.

A resistive layer 115c and a second insulating layer 115d may be sequentially formed on the absorbing layer 115b. The inside of the anchor 118 may be filled with the absorbing layer 115b, the resistive layer 115c, and the second insulating layer 115d. Accordingly, the anchor 118 may include the absorbing layer 115b, the resistive layer 115c, and the second insulating layer 115d.

The first insulating layer 115a, the absorbing layer 115b, the resistive layer 115c, and the second insulating layer 115d are etched through a photolithography process to expose the sacrificial layer 119, and an absorption plate 115 may be formed.

The sacrificial layer 119 may be removed through dry etching or wet etching. Accordingly, the reflective layer may have a depressed curved mirror shape. A distance d2 between the reflective layer and the absorption plate in a central portion of the reflective layer may be maximum. A distance d1 between the reflective layer and the absorption plate in an edge of the reflective layer may be minimum.

As described above, in a MEMS device according to an example embodiment of the present disclosure, an infrared broadband absorption structure may be provided by changing a distance between an absorption plate and a reflector depending on a position. A reflective layer of the MEMS device may have a curved or stepped shape. Accordingly, since a distance between the reflective layer and the absorption plate of the MEMS device varies depending on a position, infrared rays of a wider wavelength band may be absorbed. The MEMS device may provide high absorption efficiency to increase measurement sensitivity.

Although the present disclosure and its advantages have been described in detail, it should be understood that various changes, substitutions and alterations can be made herein without departing from the spirit and scope of the disclosure as defined by the following claims.

What is claimed is:

1. A MEMS device comprising:
a lower substrate;
an infrared sensor formed on the lower substrate; and
a lower bonding pad disposed to surround the infrared sensor,
wherein the infrared comprises:
a metal pad formed on an upper surface of the lower substrate to be electrically connected to a detection circuit;
a reflective layer formed on the upper surface of the lower substrate and reflecting an infrared band;
an absorption plate formed to be spaced apart from an upper portion of the reflective layer and absorbing infrared rays to change resistance; and
an anchor formed in an upper portion of the metal pad to support the absorption plate and to electrically connect the metal pad and the absorption plate to each other, and
wherein the reflective layer has a curved or stepped shape such that a distance between the reflective layer and the absorption plate varies depending on a position of the reflective layer.

2. The MEMS device as set forth in claim 1, wherein the distance between the reflective layer and the absorption plate ranges from 1.5 micrometers to 3 micrometers depending on a position.

3. The MEMS device as set forth in claim 1, wherein an upper surface of the reflective layer has a depressed curved surface.

4. The MEMS device as set forth in claim 1, wherein an upper surface of the reflective layer includes a plurality of depressed portions.

5. The MEMS device as set forth in claim 1, wherein an upper surface of the reflective layer is formed to have a stepped shape.

6. A method of manufacturing a MEMS device, the method comprising:
forming an insulating layer on a lower substrate;
forming a preliminary reflective layer and a metal pad on the insulating layer;
patterning the preliminary reflective layer to form a reflective layer having a curved or stepped shape;
forming a protective layer on the reflective layer; and
forming an anchor, connected to the metal pad, and an absorption plate disposed to be spaced apart from the reflective layer and supported by the anchor.

7. The method as set forth in claim 6, wherein the patterning of the preliminary reflective layer to form a reflective layer having a curved or stepped shape comprises:
depositing an auxiliary insulating layer on the metal pad and the preliminary reflective layer and patterning the auxiliary insulating layer to form an auxiliary insulating pattern such that the preliminary reflective layer is exposed; and
spin-coating a thin film on the auxiliary insulating pattern and the preliminary reflective layer to form a curved shape on the preliminary reflective layer.

8. The method as set forth in claim 6, wherein the patterning of the preliminary reflective layer to form a reflective layer having a curved or stepped shape comprises:

depositing an auxiliary insulating layer on the metal pad and the preliminary reflective layer and patterning the auxiliary insulating layer to form an auxiliary insulating pattern such that the preliminary reflective layer is exposed;

forming a photoresist thin film on the auxiliary insulating pattern and the preliminary reflective layer and exposing the photoresist thin film to form a photoresist pattern having a depressed curved surface; and drying-etching the photoresist pattern and the preliminary reflective layer to form a reflective layer having a depressed curved shape.

9. The method as set forth in claim 6, wherein the patterning of the preliminary reflective layer to form a reflective layer having a curved or stepped shape comprises:

depositing an auxiliary insulating layer on the metal pad and the preliminary reflective layer and patterning the auxiliary insulating layer to form an auxiliary insulating pattern such that the preliminary reflective layer is exposed;

forming a first photoresist pattern exposing a portion of the preliminary reflective layer and etching the preliminary reflective layer to form a depressed reflective layer;

forming a second photoresist pattern the depressed reflective layer and a portion of the preliminary reflective layer around the depressed reflective layer and etching the depressed reflective layer to form a reflective layer having a stepped structure.

10. The method as set forth in claim 6, wherein forming of an anchor, connected to the metal pad, and an absorption plate disposed to be spaced apart from the reflective layer and supported by the anchor comprises:

forming a contact hole to expose the metal pad after a sacrificial layer and a first insulating layer are formed on the protective layer;

depositing an anchor conductive layer on the lower substrate in which the contact hole is formed and patterning the anchor conductive layer to form an anchor;

forming an absorption layer on the lower substrate on which the anchor is formed and patterning the absorption layer to be separated;

forming a resistive layer and a second insulating layer on the absorption layer and patterning the second insulating layer, the resistive layer, the absorption layer, and the first insulating layer to expose the sacrificial layer; and removing the sacrificial layer.

11. A MEMS device comprising:

a sensor substrate provided with an infrared sensor; and a cap substrate wafer-bonded to the sensor substrate to constitute a cavity, wherein the sensor substrate comprises:

a lower substrate; an infrared sensor formed on the lower substrate; and a lower bonding pad disposed to surround the infrared sensor, wherein the infrared sensor comprises:

a metal pad formed on an upper surface of the lower substrate to be electrically connected to a readout integrated circuit;

a reflective layer formed on an upper surface of the lower substrate and reflecting an infrared band;

an absorption plate formed to be spaced apart from an upper portion of the reflective layer and absorbing infrared rays to change resistance; and an anchor formed in an upper portion of the metal pad to support the absorption plate and to electrically connect the metal pad and the absorption plate to each other, and wherein the reflective layer has a curved or stepped shape such that a distance between the reflective layer and the absorption plate varies depending on a position of the reflective layer.

12. The MEMS device as set forth in claim 11, wherein the cap substrate comprises:

an upper substrate;

a getter disposed in a cavity region depressed on a lower surface of the upper substrate;

a partition wall further protruding than the cavity region on the lower surface of the upper substrate, having the same structure and material as the upper substrate, and disposed to surround the cavity region;

a recess region further depressed than a disposition plane of the cavity region on the lower surface of the upper substrate and disposed to surround the partition wall; and an upper bonding pad disposed on a lower surface of the partition wall.

* * * * *